(12) United States Patent
Ito

(10) Patent No.: US 6,714,842 B1
(45) Date of Patent: Mar. 30, 2004

(54) SYNCHRONOUS POSITION CONTROL APPARATUS AND METHOD

(75) Inventor: Hiroshi Ito, Fuchu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/577,607

(22) Filed: May 25, 2000

(30) Foreign Application Priority Data

May 26, 1999 (JP) .......................................... 11-146350

(51) Int. Cl.[7] ................................................. G05D 1/02
(52) U.S. Cl. ........................ 700/302; 700/45; 318/560; 318/652
(58) Field of Search ................................ 700/187, 188, 700/193, 194, 170, 13, 44, 45, 46, 63, 302; 318/560, 568.22, 570, 632, 638, 640, 651, 652

(56) References Cited

U.S. PATENT DOCUMENTS

| | | | | |
|---|---|---|---|---|
| 3,836,835 A | * | 9/1974 | Sawyer ....................... | 318/685 |
| 4,868,474 A | * | 9/1989 | Lancraft et al. ......... | 318/568.2 |
| 4,972,311 A | * | 11/1990 | Holdgrafer et al. ........... | 700/60 |
| 5,545,962 A | * | 8/1996 | Wakui ........................ | 318/677 |
| 5,568,032 A | * | 10/1996 | Wakui ........................ | 318/632 |
| 5,661,388 A | * | 8/1997 | Kurosawa ................... | 318/625 |
| 5,814,962 A | * | 9/1998 | Mizumoto .................. | 318/600 |
| 5,909,272 A | | 6/1999 | Osanai et al. ................. | 355/53 |
| 5,939,852 A | | 8/1999 | Akutsu et al. .............. | 318/640 |
| 6,008,882 A | | 12/1999 | Ito et al. ........................ | 355/53 |
| 6,025,688 A | * | 2/2000 | Sekiguchi ................... | 318/610 |
| 6,028,376 A | | 2/2000 | Osanai et al. ................. | 310/12 |
| 6,396,234 B1 | * | 5/2002 | Tateishi ...................... | 318/632 |
| 6,437,864 B1 | * | 8/2002 | Watanabe et al. ........... | 356/399 |

OTHER PUBLICATIONS

Nise"Control Systems Engineering" 1995, pp. 336–337, 347, 413, 459 and 488–489.*

* cited by examiner

*Primary Examiner*—Leo Picard
*Assistant Examiner*—Chad Rapp
(74) *Attorney, Agent, or Firm*—Fitzpatrick, Cella, Harper & Scinto

(57) ABSTRACT

A synchronous position control apparatus includes position controllers which perform control based on position feedback for a plurality of axes to be controlled, target position command value generators for respective axes which generate target position command values to be set in a respective position controller, and converters for respective axes which convert, on the basis of predetermined transfer functions, the target position command values for the respective axes that are output from the respective target position command value generators, and set the converted values in the respective position controllers. The characteristics of the transfer functions are set to substantially the same high-frequency cutoff characteristics for the respective axes, and the cutoff frequency of the transfer function is set to a smaller value than a servo band in any one position controller.

30 Claims, 19 Drawing Sheets

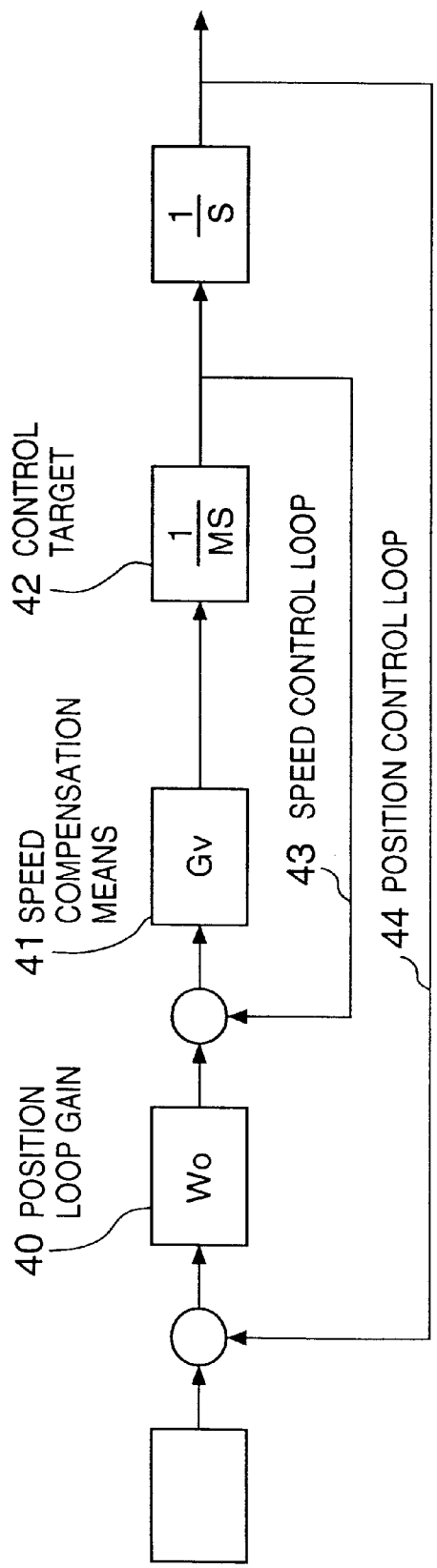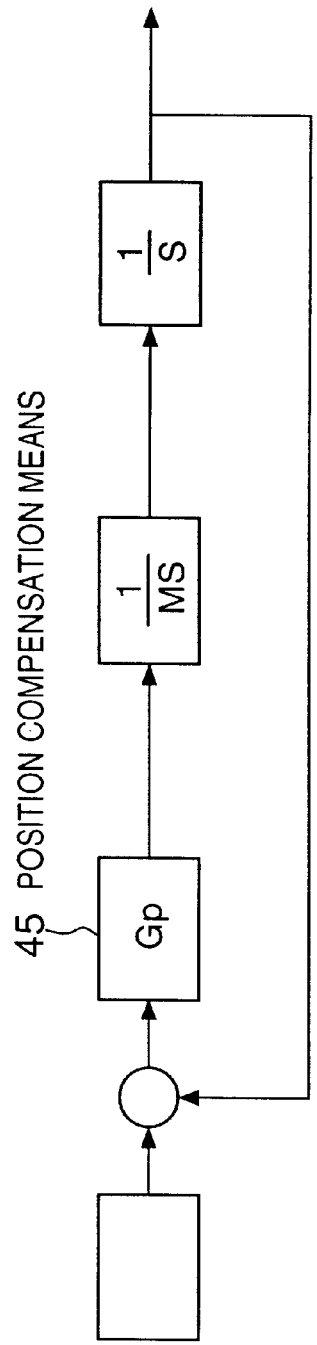

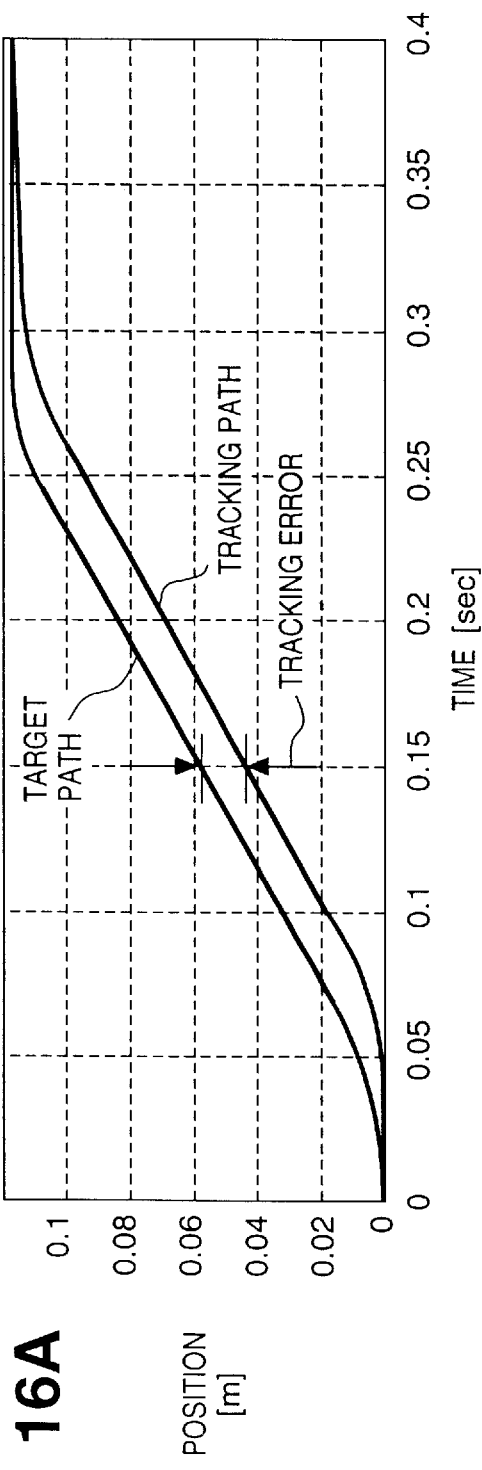
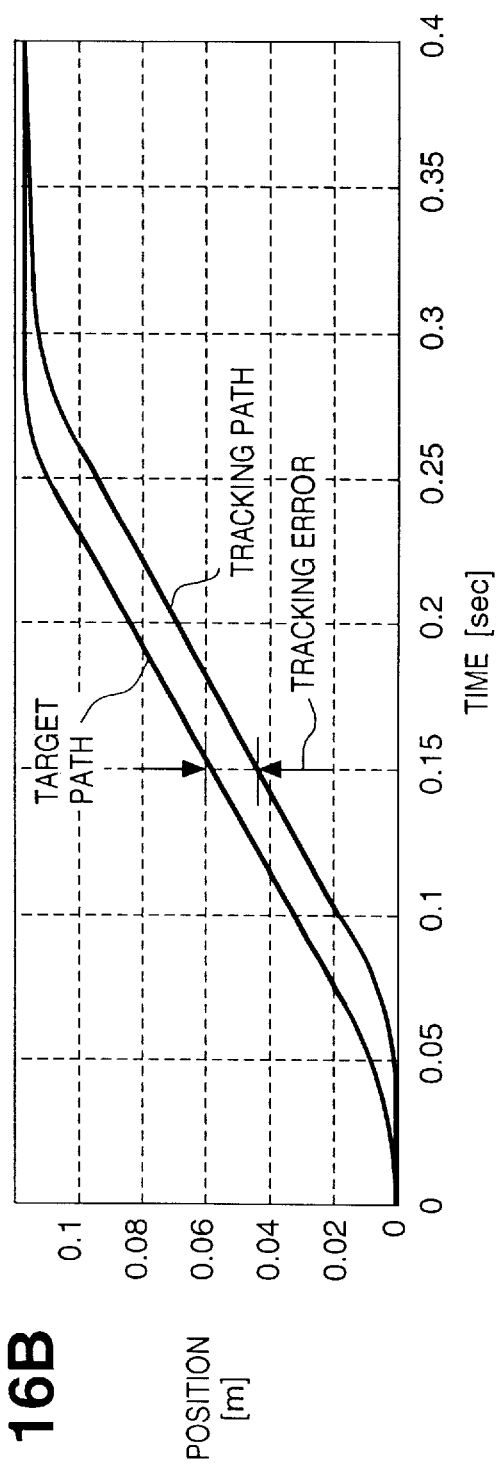
FIG. 16A
FIG. 16B

SYNCHRONOUS POSITION CONTROL APPARATUS AND METHOD

FIELD OF THE INVENTION

The present invention relates to a synchronous position control apparatus and method and, more particularly, to a synchronous position control apparatus and method preferably applied to a scanning semiconductor exposure apparatus, machine tool and the like, that must maintain the synchronous relationship between the positions of two or more control targets at high precision.

BACKGROUND OF THE INVENTION

In general, for example, a machine tool for mold processing must cut a free surface at high precision. This control is called contour control.

In contour control, the cutting performance of the machine tool is determined by the synchronous performance between positions along a plurality of axes serving as control targets attached to the machine tool.

In a normal position control system, a tracking error from a target position is processed as an important control index. In contour control, ensuring the synchronous characteristic between axes is more important than the tracking performance to a target position in realizing a high-performance apparatus. This will be exemplified.

FIGS. 12A and 12B show a conventional synchronous position control system for two orthogonal axes on the XY plane which assumes the XY table of a machine tool. FIG. 12A shows an X-axis position control system, and FIG. 12B shows a Y-axis position control system.

In FIGS. 12A and 12B, these position control systems have time-lags of first order with respect to target position command values $2a$ and $2b$ output from target position command value generation means (target position command value generators) $1a$ and $1b$. Wox and Woy represent position loop gains $40a$ and $40b$ expressing the cutoff frequencies of these time-lags of first order.

FIG. 15 shows a locus on the plane when a straight path is drawn on the XY plane for Wox=Woy=5 Hz, i.e., the tracking locus of a low-gain synchronous position control system. FIGS. 16A and 16B show tracking errors along the X- and Y-axes at that time, i.e., the time response of the low-gain synchronous position control system.

FIG. 17 shows a locus on the plane when a straight line is drawn on the XY plane for high gains of Wox=10 Hz and Woy=12 Hz, i.e., the tracking locus of a high-gain synchronous position control system. FIGS. 18A and 18B show tracking errors along the X- and Y-axes at that time, i.e., the time response of the high-gain synchronous position control system.

For a low gain, as shown in FIGS. 15, 16A, and 16B, the tracking performance of the position control system is low, but its synchronous performance is high. For a high gain, as shown in FIGS. 17, 18A, and 18B, the tracking performance of the position control system is high, but its synchronous performance is low.

From the comparison between them, the system with a low response characteristic in FIGS. 15, 16A, and 16B exhibits a smaller path error from a target path regardless of a large tracking error.

As is apparent from this example, in a system in which synchronous performance for respective axes to be controlled is important, high control performance cannot be attained only by increasing the gain of the position control system and enhancing tracking performance. Synchronous control performance must be enhanced by making position control characteristics between control axes coincide with each other.

In position control of a machine tool which performs contour control, different servo characteristics along respective control axes impair the synchronous relationship between these axes. An error occurs between a target cutting path and an actual cutting path, resulting in low processing precision. To prevent this, servo characteristics along the control axes must coincide with each other as much as possible so as to maintain a synchronous relationship between these axes.

To realize a synchronous position control system capable of maintaining a synchronous relationship between respective axes, a position control system as shown in FIG. 13 is constituted in a conventional machine tool.

This servo system has a high-gain speed control loop 43, and a low-gain position control loop 44 outside the speed control loop 43. The servo system is built in this way in order to ensure system stability and suppress disturbance by the speed control loop, and ensure a response characteristic, and particularly, a synchronous characteristic, along each axis to a target value by the position control loop.

For example, when the control axes are three X-, Y-, and Z-axes in a mold processing unit, the gains of position control loops for the three axes must be the same, but the gains of speed control loops cannot always be the same. This is because mechanical structures for the respective axes are different owing to mechanical factors, and mechanical resonant points which determine the gains of the speed control loops are different.

To suppress disturbance, the gain of the speed control loop is desirably as high as possible. However, the gains of the speed control loops for control axes are generally different under limitations of mechanical resonance. Even if the gains of the position control loops are the same, the gains of the speed control loops for the respective axes are not always the same, and thus, the response characteristics along the respective axes to a target position value are different.

In the position control system of the machine tool, the gain of the position control loop is generally set as low as about $\frac{1}{10}$ the gain of the speed control loop. In this case, the characteristics of the speed control loop rarely appear on the response characteristic of the position control system to a target position value. For this reason, a control system having an arrangement as shown in FIG. 13 can build a synchronous position control system for each axis.

In the conventional synchronous position control system, however, the speed control loop serves as an internal loop of the position control loop, and the gains of these loops may interfere with each other.

That is, when the gain of the position control loop is set about $\frac{1}{10}$ or less the gain of the speed control loop according to the above method, the characteristics of the two control loops can be set substantially independently.

If the gain of the position control loop must be set high in terms of the response characteristic, the gains of the two control loops are difficult to maintain at greatly different values. In other words, if a high gain is set in the position control loop, the characteristics of the speed control loop appear as a response to a target position value. At this time, different characteristics of the speed control loops for respective axes deteriorate the synchronous position control characteristic.

In the conventional arrangement, the response characteristic to a target value is determined by the gain of the position control loop. In simple position control, which does not require synchronous position control, the settling time of the control system becomes long.

The response characteristic to a target value is approximated by a system of a time lag of a first order using the gain of the position control loop as a cutoff frequency, but is difficult to cope with a case in which response characteristics except for the first-order lag characteristic are desirable.

The position control system for determining synchronous performance forms a feedback system. This poses problems in system design such that a designer who does not know a control system is difficult to design a synchronous control system.

SUMMARY OF THE INVENTION

The present invention has been made to overcome the conventional drawbacks, and has as its first object to increase the degree of freedom for adjusting the response characteristic to a target value. It is the second object of the present invention to shorten the settling time in simple positioning control. It is the third object of the present invention to realize an arrangement which can facilitate the design.

To achieve the above objects, as the first synchronous position control apparatus of the present invention, a synchronous position control apparatus comprises position controllers which perform control based on position feedback control for a plurality of axes to be controlled, target position command value generators for respective axes which generate target position command values to be set in the respective position controllers, and converters for respective axes which convert, on the basis of predetermined transfer functions, the target position command values for the respective axes that are output from the respective target position command value generators, and setting the converted values in the respective position controllers, wherein characteristics of the transfer functions are set to substantially the same high-frequency cutoff characteristics for the respective axes, and the cutoff frequency of the transfer function is set to a smaller value than a servo band in any desired position controller.

As the first synchronous position control method of the present invention, a synchronous position control method of performing synchronous position control by setting target position command values for position control mechanisms for performing control based on position feedback control for a plurality of axes to be controlled comprises converting the respective target position command values for the respective axes on the basis of predetermined transfer functions, and setting the converted values in the respective position control mechanisms, and setting characteristics of the transfer functions to substantially the same high-frequency cutoff characteristics for the respective axes, and setting the cutoff frequency of the transfer function to a smaller value than a servo band in any desired position control mechanism.

In the prior art, a synchronous position control apparatus is constituted by position controllers having a relatively low response characteristic. In the present invention, a synchronous position control apparatus is constituted by position controllers having a high response characteristic. Further, filters (converters) having a high-frequency cutoff characteristic are inserted on the input stages of the respective position controllers. The characteristics of the filters are set to coincide with each other for all the control axes, and the cutoff frequencies of the filters are set lower than any position control loop gains for all the control axes.

When the filter is used on the input stage of the position control loop having a high response characteristic, the response characteristic to a position command value is substantially determined by the response characteristic of the filter. Therefore, by setting the characteristics of the filters to coincide with each other for all the control axes, response characteristics to position command values can substantially coincide with each other for all the control axes. A synchronous position control apparatus having high synchronous performance can be easily constituted.

Since the characteristics of the filter (converter) can be set independently of the stability of the control system, the degree of freedom for adjusting the response characteristic to a position command value can be increased. The filter which determines the response characteristic only converts a target position command value. In simple positioning control which does not require synchronous control, the target position command value can be supplied without the mediacy of this filter. Thus, the synchronous position control apparatus can be used as a system having high positioning performance.

As the second synchronous position control apparatus of the present invention, a synchronous position control apparatus comprises acceleration command value generators which generate target acceleration command values for a plurality of axes to be controlled, converters for the respective axes which convert the respective target acceleration command values in accordance with predetermined transfer functions, and outputting the converted values as converted acceleration command values, integrators for the respective axes which integrate the respective converted acceleration command values twice, and outputting the integrated values as position command values, compensators for the respective axes which perform predetermined compensation for the respective converted acceleration command values, and outputting the compensated values as feedforward signals, and position controllers which perform control based on position feedback control for the respective axes on the basis of the respective position command values and the feedforward signals, wherein characteristics of the transfer functions are set to substantially the same high-frequency cutoff characteristics for the respective axes, and the cutoff frequency of the transfer function is set to a smaller value than a servo band in any desired position controller.

As the second synchronous position control method of the present invention, a synchronous position control method comprises an acceleration command value generation step of generating target acceleration command values for a plurality of axes to be controlled, a conversion step of converting the respective target acceleration command in accordance with predetermined transfer functions for the respective axes, and outputting the converted values as converted acceleration command values, an integral step of integrating the respective converted acceleration command values twice, and outputting the integrated values as position command values for the respective axes, a compensation step of performing predetermined compensation for the respective converted acceleration command values, and outputting the compensated values as feedforward signals for the respective axes, and a position control step of performing control based on position feedback control for the respective axes on the basis of the position command values and the feed forward signals, wherein characteristics of the transfer functions are set to substantially the same high-frequency cutoff characteristics for the respective axes, and the cutoff frequency of the transfer function is set to a smaller value than a servo band in any desired position feedback control.

The second aspect adopts a feedforward loop for a target value to improve tracking performance to the target value. The structure of the compensator in the feedforward loop is simple and can be easily realized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 13 is a block diagram showing the arrangement of a conventional position control system;

FIG. 14 is a block diagram showing the arrangement of a position control means (position controller) in the position control apparatus shown in FIG. 1;

FIGS. 16A and 16B are graphs of a time response showing the contour control characteristic of the synchronous position control system shown in FIGS. 12A and 12B for a low gain;

DETAILED DESCRIPTION OF THE PREFERRED EMBODIMENTS

Preferred embodiments of a synchronous position control apparatus and method according to the present invention will be described in detail below with reference to the accompanying drawings.

The synchronous position control apparatus and method according to the following embodiments improve a synchronous control characteristic by inserting prefilters on input stages of respective position control means (position controllers) or position control step, and setting the characteristics of the prefilters such that transfer characteristics of combinations of the prefilters and position control means (position controllers) for respective axes to be controlled substantially coincide with each other for all the axes.

In the embodiments, "almost the same transfer characteristics" mean not only the same transfer characteristics but also slightly different transfer characteristics so long as the apparatus performance is not influenced.

When the synchronous position control apparatus or method according to each embodiment is applied to synchronous position control for the two axes of a wafer stage and reticle stage in a scanning semiconductor exposure apparatus, the present invention further comprises a coefficient multiplying means (coefficient multiplier) for multiplying a tracking position along one axis by a predetermined coefficient, a correction means (corrector) for obtaining a correction value to be added to a position command value for any axis on the basis of a synchronous error as the difference between the tracking position multiplied by the coefficient and a tracking position along the other axis, and an addition means (adder) for adding the correction value to the position command value for either axis. Accordingly, synchronous position control performance is improved.

First Embodiment

Figure 1:
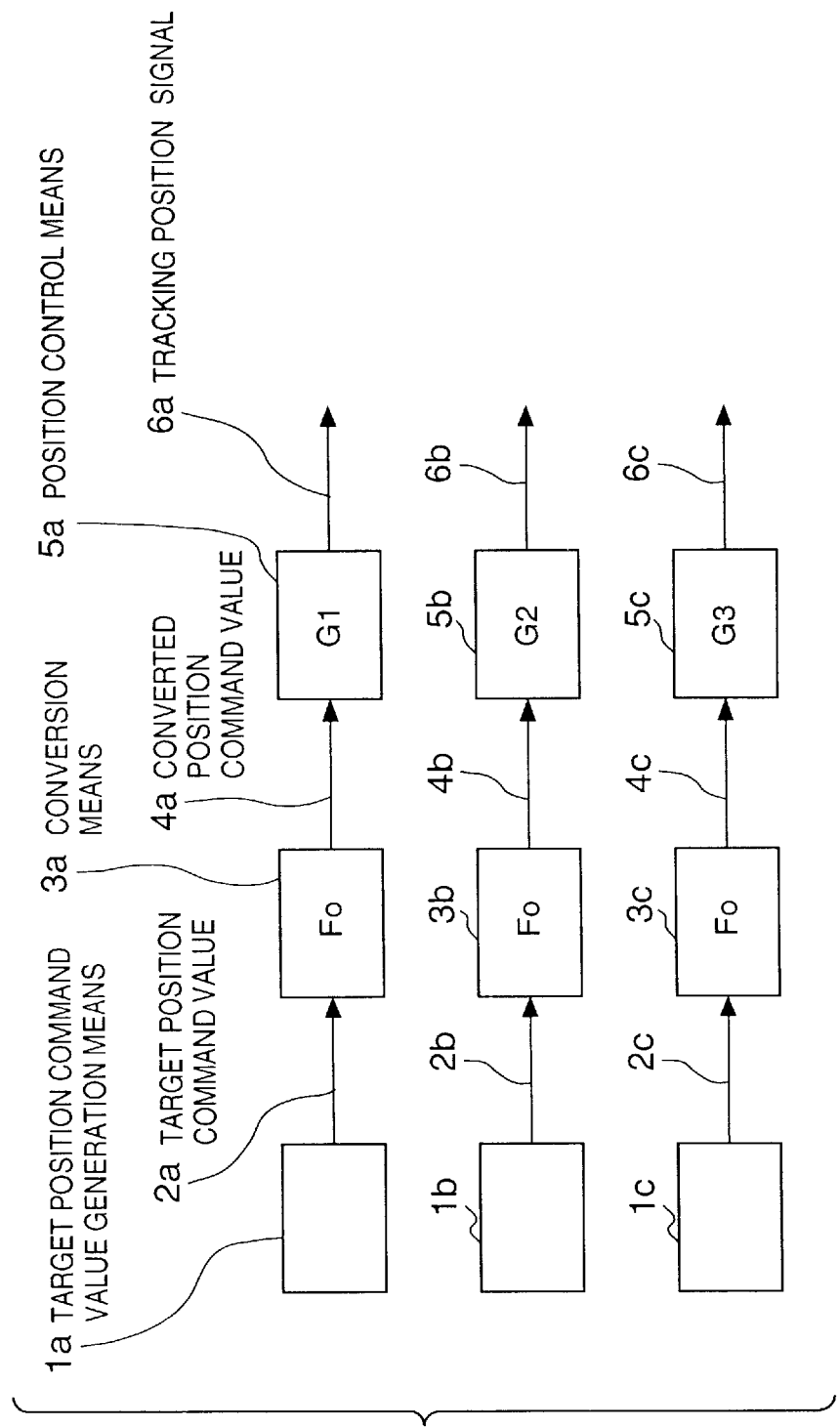
FIG. 1 is a block diagram showing a synchronous position control apparatus according to the first embodiment of the present invention.

FIG. 1 is a block diagram showing a synchronous position control apparatus according to the first embodiment of the present invention. The first embodiment assumes that the apparatus is applied to a machine tool for performing contour control along three, X-, Y-, and Z-axes perpendicular to each other along which a mold is cut. The X-, Y-, and Z-axes are defined as the first, second, and third axes, respectively.

In FIG. 1, these axes are discriminated by reference symbols "a", "b", and "c" suffixed to the reference numerals of the first, second, and third axes.

In the synchronous position control apparatus according to the first embodiment, as shown in FIG. 1, a target position command value $2a$ generated by a target position command value generation means (target position command value generator) $1a$ is converted into a converted position command value $4a$ whose high-frequency vibration component is cut by a command value conversion means (command value converter) $3a$. The converted position command value 4a is supplied to a position control means (position controller) 5a. The second and third axes also have the same arrangement as the first axis.

In the control system with this arrangement, conversion means 3a, 3b, and 3c for the respective axes are second-order filters having almost the same frequency characteristics and high-frequency cutoff characteristics. The position control means 5a has a single-loop arrangement using a position control loop, like the one shown in FIG. 14. A position compensation means (position compensator) 45 in this arrangement is a PID compensator. Position control means (position controllers) 5b and 5c for the second and third axes also have the same arrangement.

In the control system of FIG. 1, the gains of the position control loops (to be referred to as position loop gains hereinafter) of the position control means 5a, 5b, and 5c are 80 Hz, 90 Hz, and 100 Hz, respectively. The cutoff frequencies of the command value conversion means 3a, 3b, and 3c are 5 Hz, which is much lower than the position loop gains of the position control means for the respective axes.

With these settings, responses to target command values for the respective axes are determined by responses at about 5 Hz from the high-frequency cutoff filters (conversion means 3a to 3c). Position response characteristics along the respective axes substantially coincide with each other, and a system having a high synchronous characteristic between the axes can be built.

Figure 19:
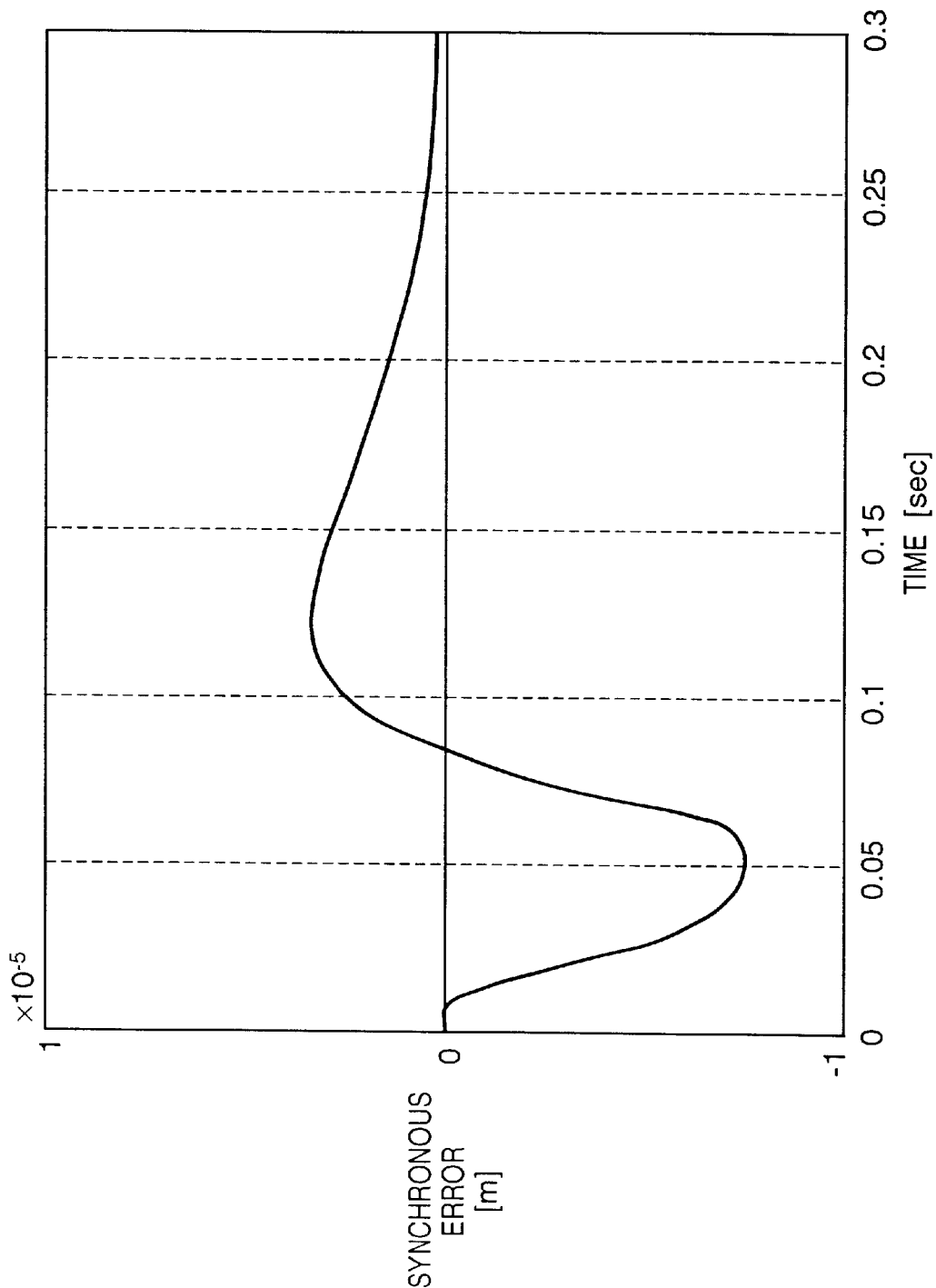
FIG. 19 is a graph showing a synchronous error in a synchronous position control system using the conventional position control system shown in FIG. 13.
Figure 20:
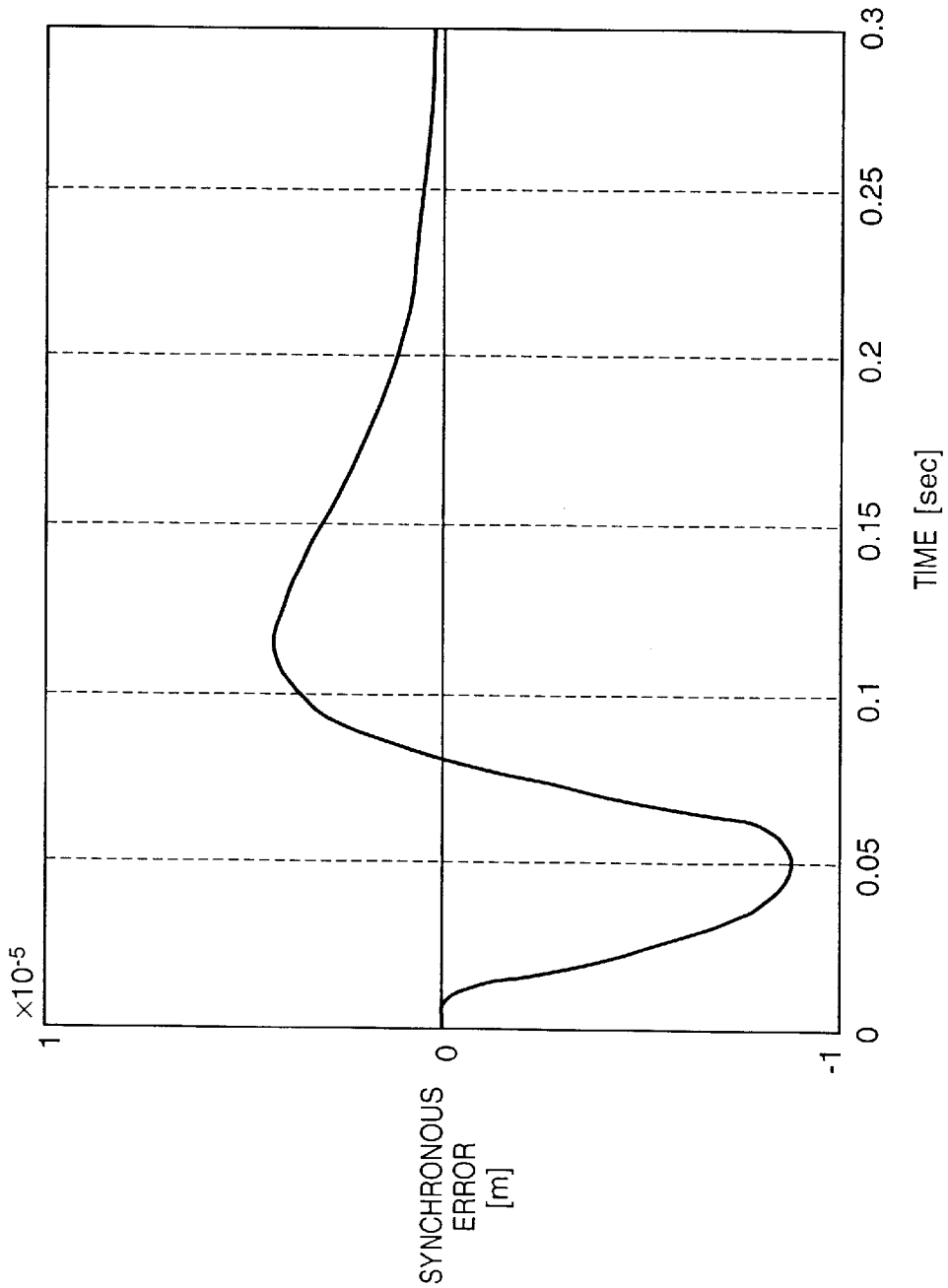
FIG. 20 is a graph showing a synchronous error in the synchronous position control apparatus shown in FIG. 1.

As described above, the arrangement for one axis in a conventional synchronous position control system includes a speed control loop as shown in FIG. 13. The position loop gains of this system are set to 5 Hz for all the axes, and the gains of the speed control loops for the first, second, and third axes are set to 80 Hz, 90 Hz, and 100 Hz, respectively. With these settings, for example, the first and second axes exhibit a synchronous error as shown in FIG. 19. In the first embodiment, the first and second axes exhibit a synchronous error as shown in FIG. 20. As is apparent from FIGS. 19 and 20, the first and second axes obtain almost the same synchronous control performance.

By adopting the control system shown in FIG. 1, a synchronous position control system can be built only by inserting the conversion means on the input stages of the respective position control means without changing the characteristics of the control system in the position control system having position control means with different control characteristics. This synchronous position control system can be easily applied to various systems.

The first embodiment has exemplified a synchronous position control apparatus for three axes. For a larger number of axes, the number of arrangements for 1-axis control can be increased by a necessary number of axes to easily implement a synchronous position control apparatus for multiple axes.

Second Embodiment

Figure 2:
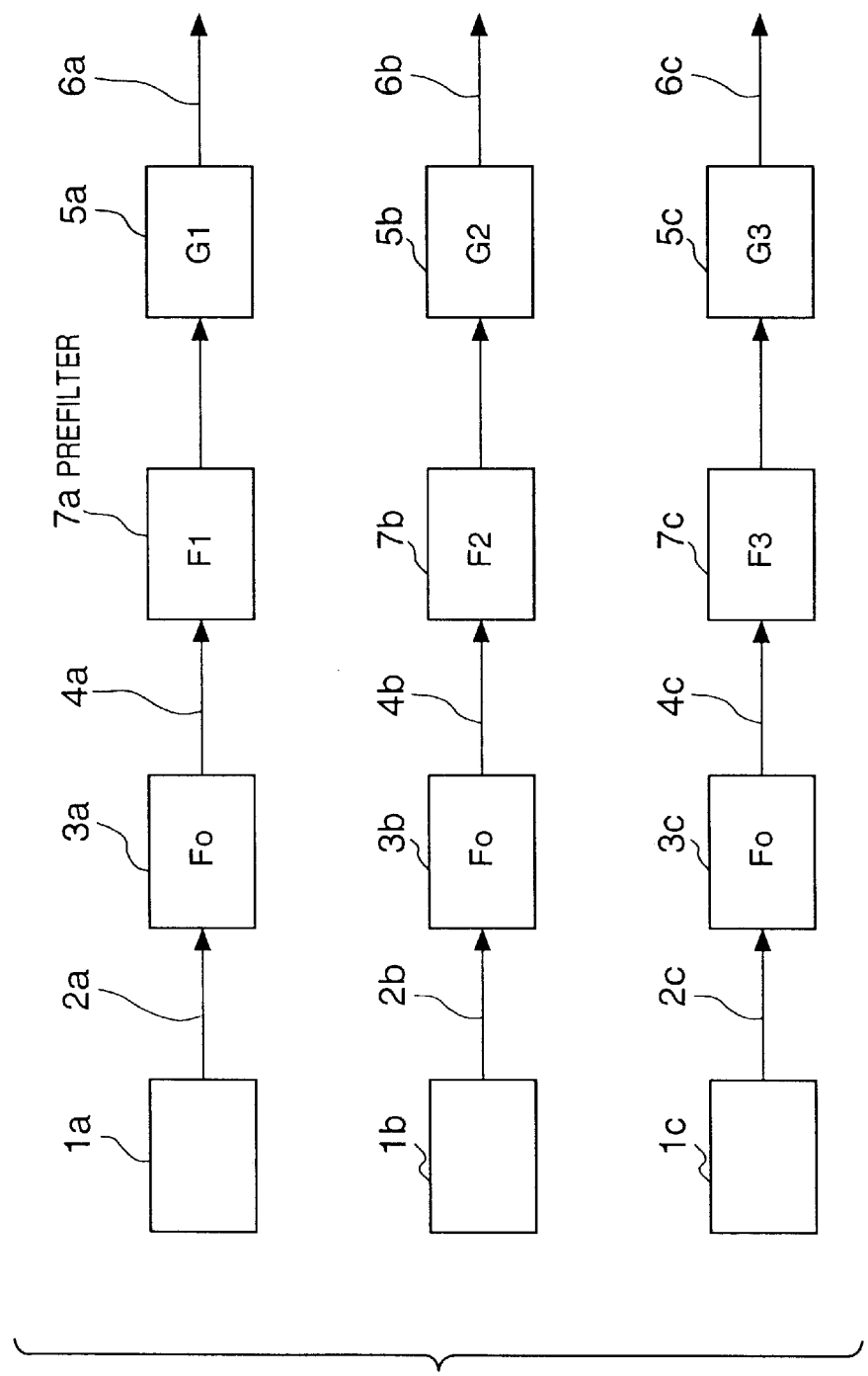
FIG. 2 is a block diagram showing a synchronous position control apparatus according to the second embodiment of the present invention.

FIG. 2 is a block diagram showing a synchronous position control apparatus according to the second embodiment of the present invention. In this apparatus, prefilters are inserted on the input stages of respective position control means to make position control characteristics to target values along respective axes substantially coincide with each other and to improve the synchronous position control characteristic.

As described above, to move a plurality of axes in accordance with target position command values, response characteristics to the target values along the respective control axes must coincide with each other. For this purpose, the first embodiment improves the synchronous position control characteristic by inserting high-frequency cutoff filters (conversion means) having the same characteristics on the input stages of position control means having different response characteristics to position command values. To the contrary, the second embodiment makes the transfer characteristics of combinations of prefilters and position control means substantially consistent for all the axes.

As shown in FIG. 2, the transfer functions of position control means 5a, 5b, and 5c are defined as G1, G2, and G3, respectively. The transfer functions of prefilters 7a, 7b, and 7c are defined as F1, F2, and F3, respectively. The prefilters 7a, 7b, and 7c are set to satisfy F1×G1=F2×G2=F3×G3. Transfer functions from target position value signals to tracking positions in the position control means 5a to 5c after the prefilters 7a to 7c can be made equal for all the axes.

In the second embodiment, the transfer function F1 is set to unity, and F2 and F3 are defined as F2=G1/G2 and F3=G1/G3. In principle, the axes have no synchronous position error between them. In practice, the transfer functions G1, G2, and G3 are high-order transfer functions, the coefficient of a high-order term is difficult to obtain, and the coefficient varies. The transfer functions F2 and F3 are, therefore, difficult to define in the above way. For this reason, the transfer functions F2 and F3 of the compensators 7b and 7c are defined by approximating these transfer functions. Even in this case, the synchronous control characteristic can be improved compared to the control system described in the first embodiment.

Third Embodiment

Figure 3:
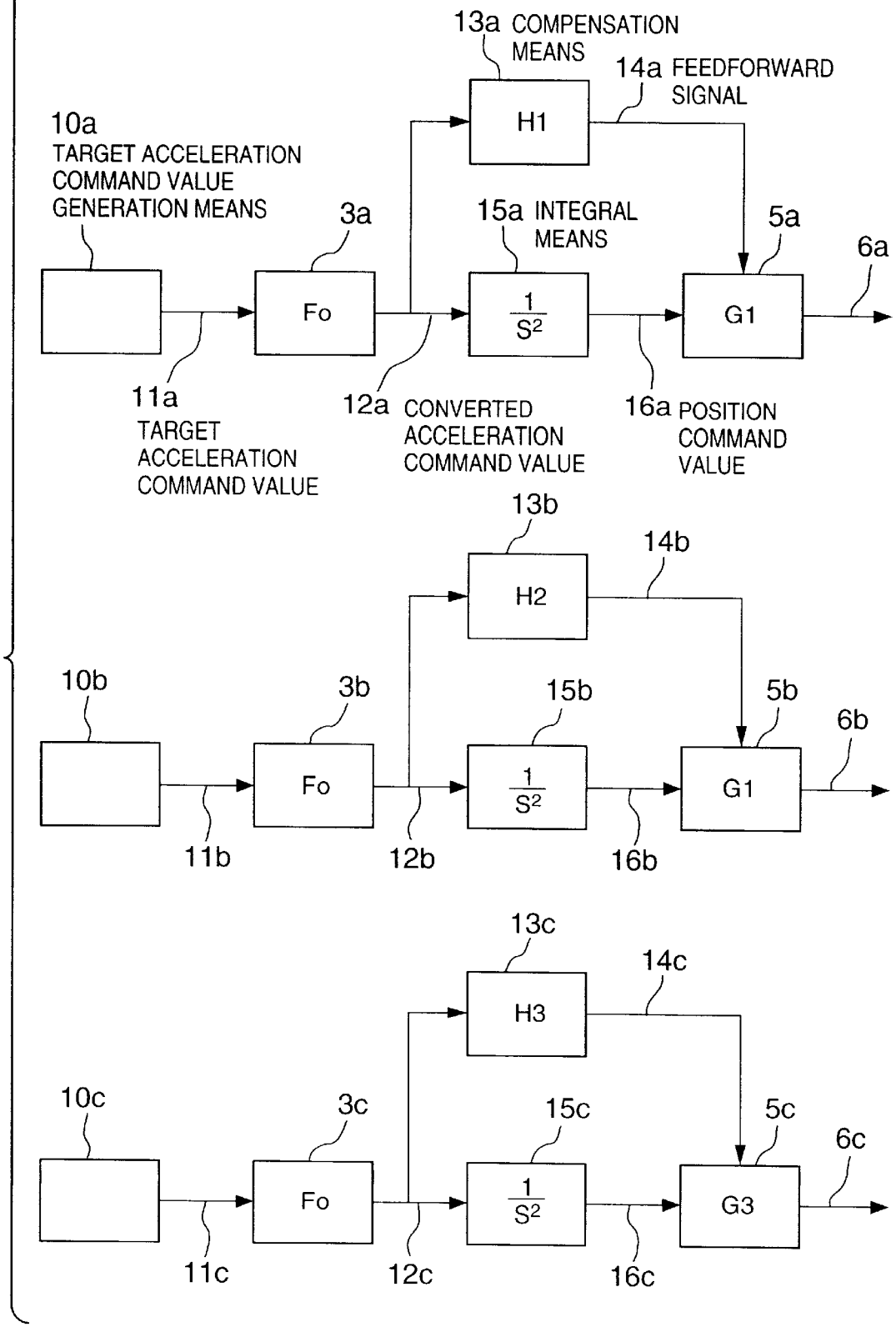
FIG. 3 is a block diagram showing a synchronous position control apparatus according to the third embodiment of the present invention.

FIG. 3 is a block diagram showing a synchronous position control apparatus according to the third embodiment of the present invention. This embodiment improves tracking performance to a target value by using a feedforward loop for the target value.

Changing the transfer characteristic by a prefilter as in the second embodiment complicates the transfer function of the prefilter. To the contrary, in the feedforward loop method of the third embodiment, the structure of the compensator is simple and can be easily implemented.

The operation for the first axis in the apparatus of FIG. 3 will be explained. As shown in FIG. 3, the high-frequency component of a target acceleration command value 11a generated by a target acceleration command value generation means 10a is cut by a conversion means 3a to obtain a converted acceleration command value 12a. The converted acceleration command value 12a is integrated twice by an integral means (integrator) 15a to obtain a position command value 16a. The position command value 16a is supplied to a position control means 5a.

The converted acceleration command value 12a is converted into a feedforward signal 14a by a compensation means 13a, and the feedforward signal 14a is supplied to the position control means 5a. The position control means 5a is driven by the position command value 16a and the feedforward signal 14a. The arrangement and operation for the second and third axes are the same as those for the first axis, and a repetitive description thereof will be omitted.

The block diagram of FIG. 3 does not show feedforward processing in detail, and thus a detailed arrangement of the position control means 5a for the first axis in FIG. 3 will be described with reference to FIG. 9. The arrangement and operation for the second and third axes are the same as those for the first axis, and a repetitive description thereof will be omitted.

Figure 9:
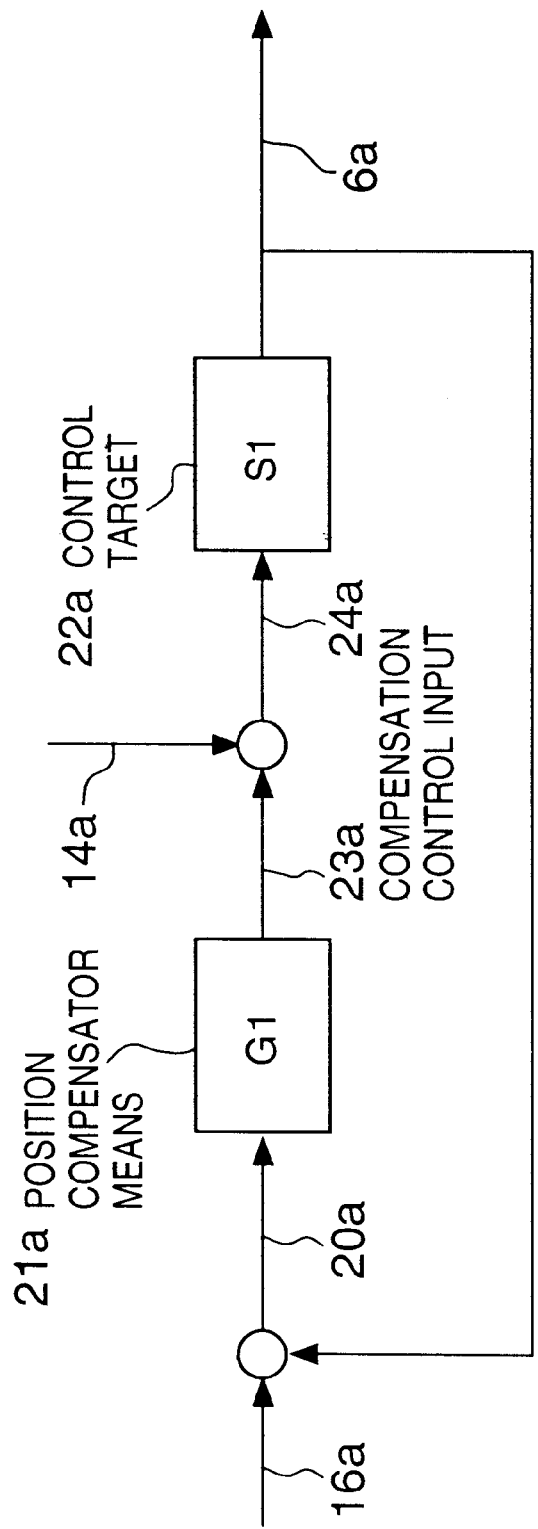
FIG. 9 is a block diagram showing the arrangement of a position control means in the apparatus of FIG. 3.

As shown in FIG. 9, a positional error 20a is obtained from the difference between the position command value 16a and a tracking position 6a of a control target 22a. A position compensator 21a calculates a compensation control input 23a based on the positional error 20a. The position compensator 21a is generally a PID compensator. A control input 24a as the sum of the compensation control input 23a and the feedforward signal 14a output from the compensation means 13a drives the control target 22a.

The feedforward signal 14a is determined by the characteristics of the control target 22a. When the tracking position 6a perfectly follows the target position command value 16a, a characteristic Hi of the compensation means 13a which calculates the feedforward signal 14a in the arrangement shown in FIG. 9 can be given by $$H1 = (1/s^2)/S1 \quad (1)$$

where s is the Laplacian operator, and S1 is the transfer function expressing the characteristic of the control target 22a. When the control target 22a is represented by a model as shown in FIG. 10, the characteristic H1 of the compensation means 13a is as given below.

Figure 10:
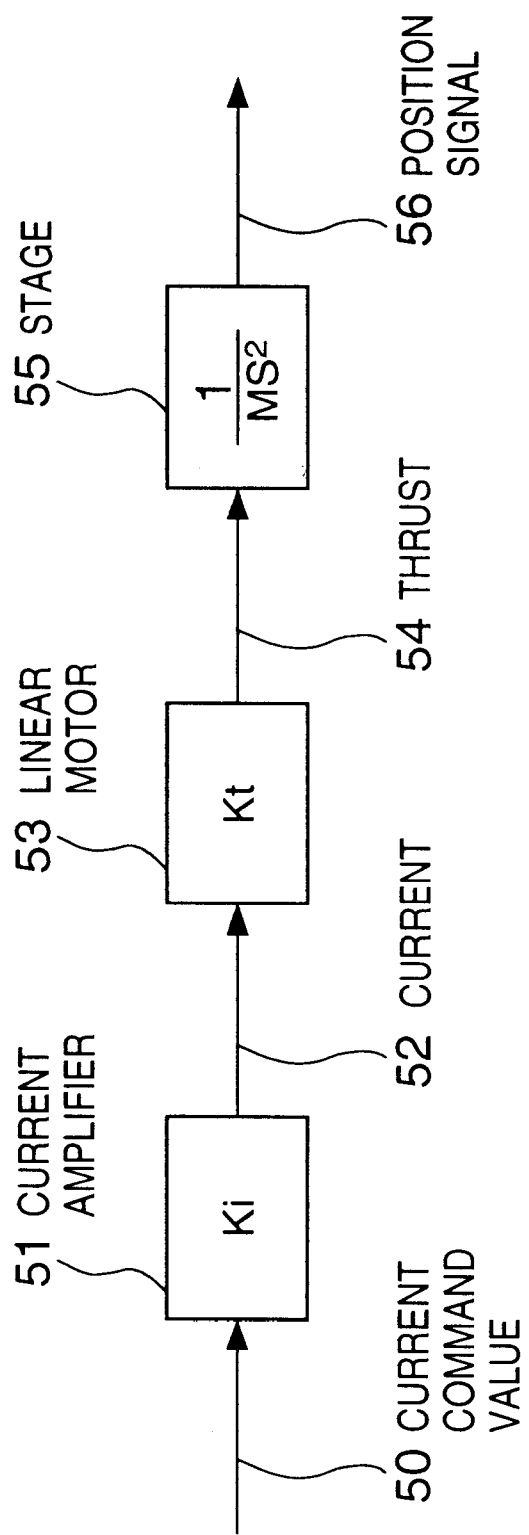
FIG. 10 is a block diagram showing the arrangement of a control target in FIGS. 8 and 9.

FIG. 10 shows a control target by a simple mechanical system using a linear motor as an actuator. In FIG. 10, M represents the mass of a stage 55; Ki, the gain of a current amplifier 51; and K5, the thrust constant of a linear motor 53. The control input to this system is a current command value 50.

Substituting the characteristic of the model in FIG. 10 into equation (1) yields the characteristic of the compensation means 13a in this example:

$$H1 = M/(Kt \times Ki) \quad (2)$$

Fourth Embodiment

Figure 4:
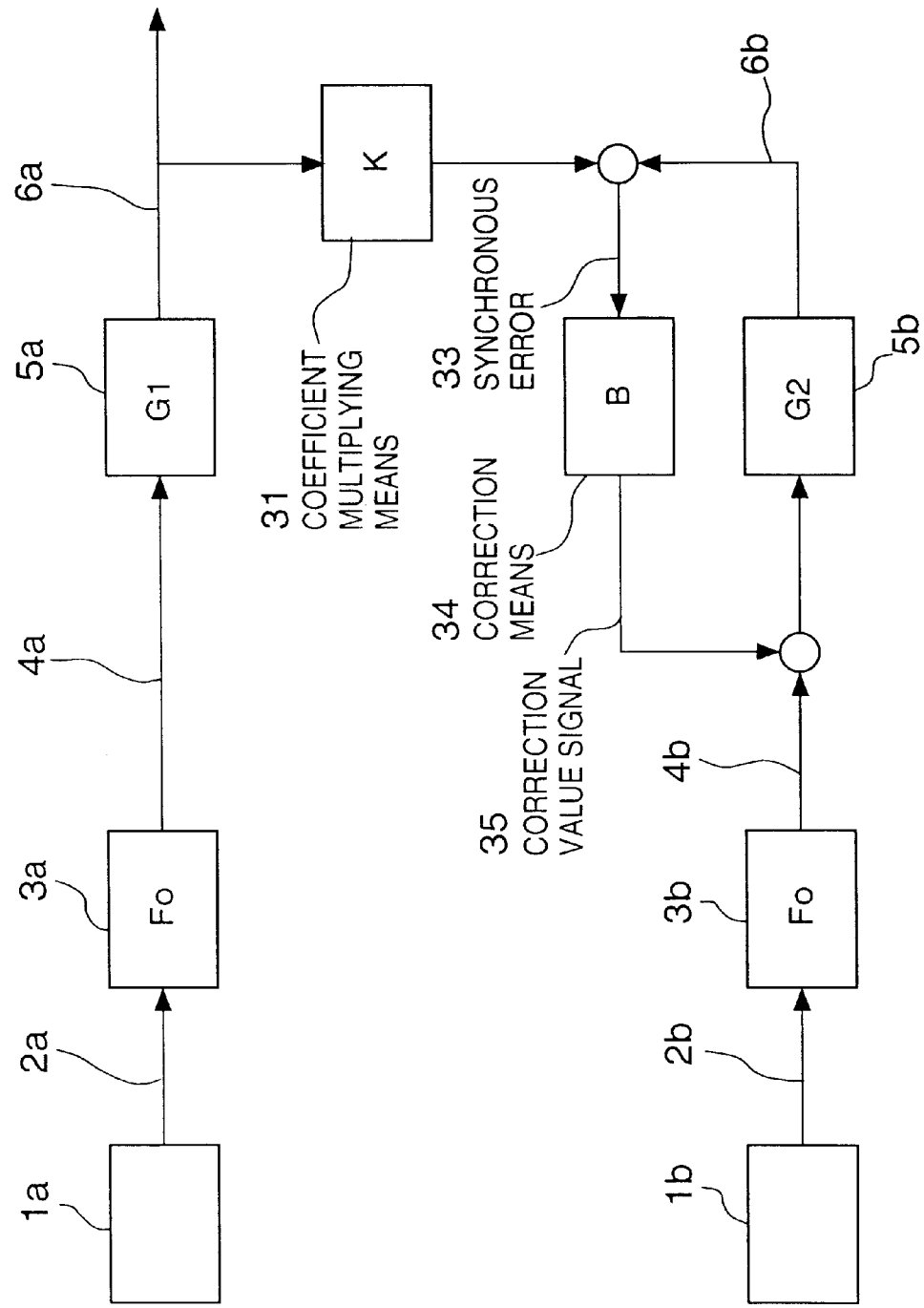
FIG. 4 is a block diagram showing a synchronous position control apparatus according to the fourth embodiment of the present invention.

FIG. 4 is a block diagram showing a synchronous position control apparatus according to the fourth embodiment of the present invention. In this embodiment, axes to be controlled are limited to two axes, and synchronous position control performance is improved by performing correction based on a synchronous error between the two axes.

This control is effective in a system in which the positions of two control targets desirably have a proportional relationship. In practice, this control is applied to a synchronous position control system for a wafer stage and reticle stage in a scanning semiconductor exposure apparatus or to a portal machine tool for controlling two columns by separate actuators.

The arrangement in FIG. 4 is the basic arrangement of a system using synchronous correction. The operation in this arrangement will be explained. The high-frequency vibration component of a target position command value 2a generated by a target position generation means 1a is cut by a filter 3a to obtain a new converted position command value 4a. The position command value 4a is supplied to a first position control means 5a.

A position command value 2b generated by a target position value generation means 1b for the second axis is converted into a converted position command value 4b by a conversion means 3b. A synchronous error 33 is obtained from the difference between a tracking position 6b of a second position control means 5b and a position prepared by multiplying a position 6a of the first position control means by a predetermined coefficient K. A synchronous correction means (synchronous corrector) 34 receives the synchronous error 33 to output a synchronous compensation value 35. In this embodiment, the synchronous correction means 34 an integral compensator. The sum of the converted position command value 4b and the synchronous compensation value 35 serves as a position command value to the second position control means 5b.

A control loop for calculating any synchronous error between two axes and compensating for the error will be called a synchronous loop. Even when a synchronous error occurs between tracking positions along the first and second axes in an arrangement having this synchronous loop, the synchronous compensator 34 can move the second axis by the error amount to maintain a synchronous relationship between the two axes.

A control system including the synchronous loop as in the fourth embodiment is most different in characteristics against disturbance from a control system having no synchronous loop as in the first to third embodiments. That is, in the arrangement of the control system having no synchronous loop, disturbance generated on each axis is suppressed by only the servo characteristic along the axis. To the contrary, the arrangement having the synchronous loop as in the fourth embodiment can reduce distribution that cannot be suppressed on the first axis, by moving the second axis using the synchronous loop.

For this reason, the arrangement having the synchronous loop attains higher synchronous position control performance than in the arrangement having no synchronous loop. The fourth embodiment uses a simple integral compensator (I compensator) as the synchronous correction means 34, but the synchronous correction means 34 can be formed from a PI compensator, PID compensator, or the like.

Fifth Embodiment

Figure 5:
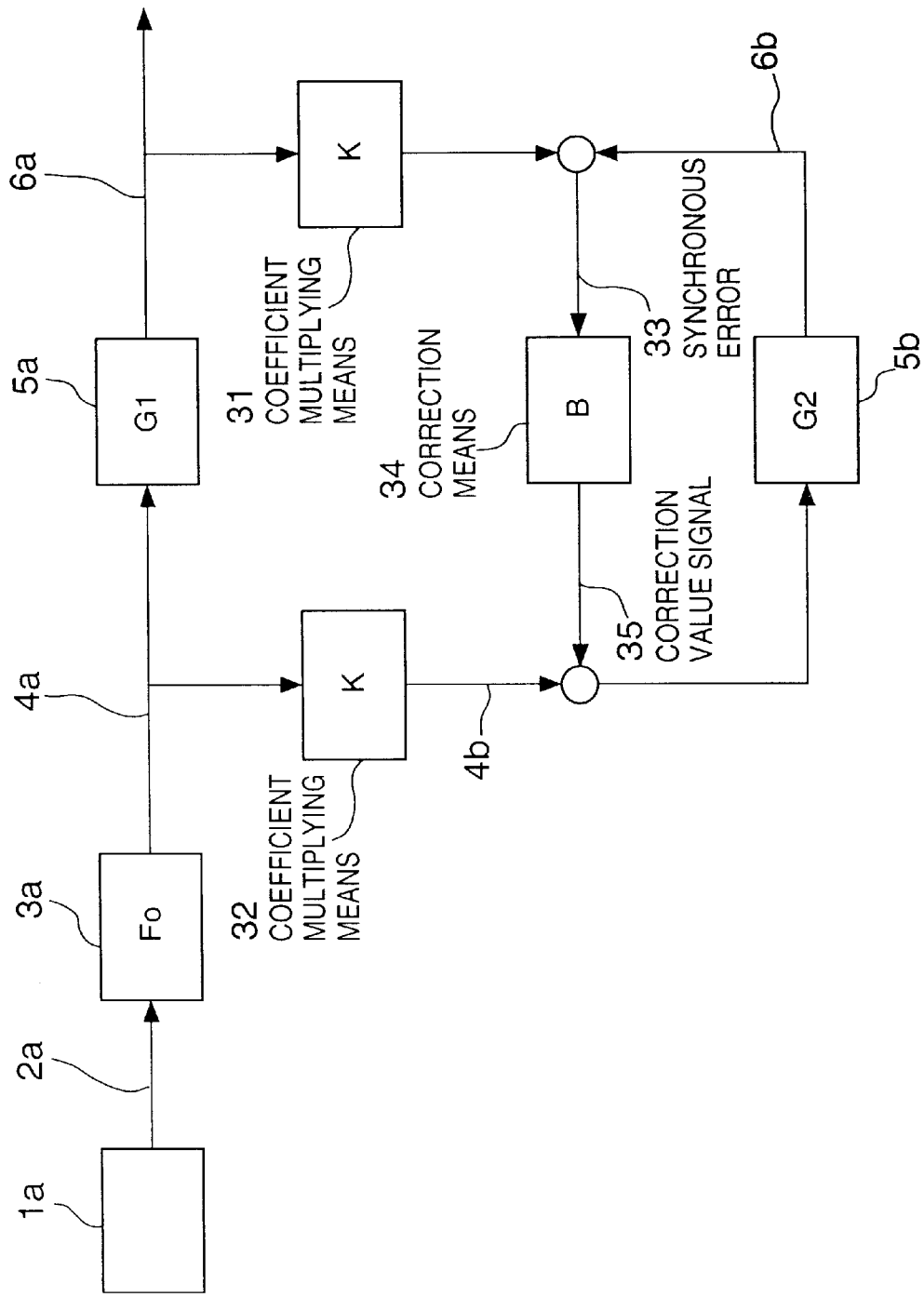
FIG. 5 is a block diagram showing a synchronous position control apparatus according to the fifth embodiment of the present invention.

The fourth embodiment independently generates a target position command value for the second axis. Alternatively, as in the fifth embodiment of the present invention shown in FIG. 5, a converted position command value 4b for the second axis may be obtained by multiplying a converted position command value 4a for the first axis by K by a coefficient multiplying means 32, and the target value generation means 1b and conversion means 3b for the second axis in the fourth embodiment may be omitted.

Sixth Embodiment

Figure 6:
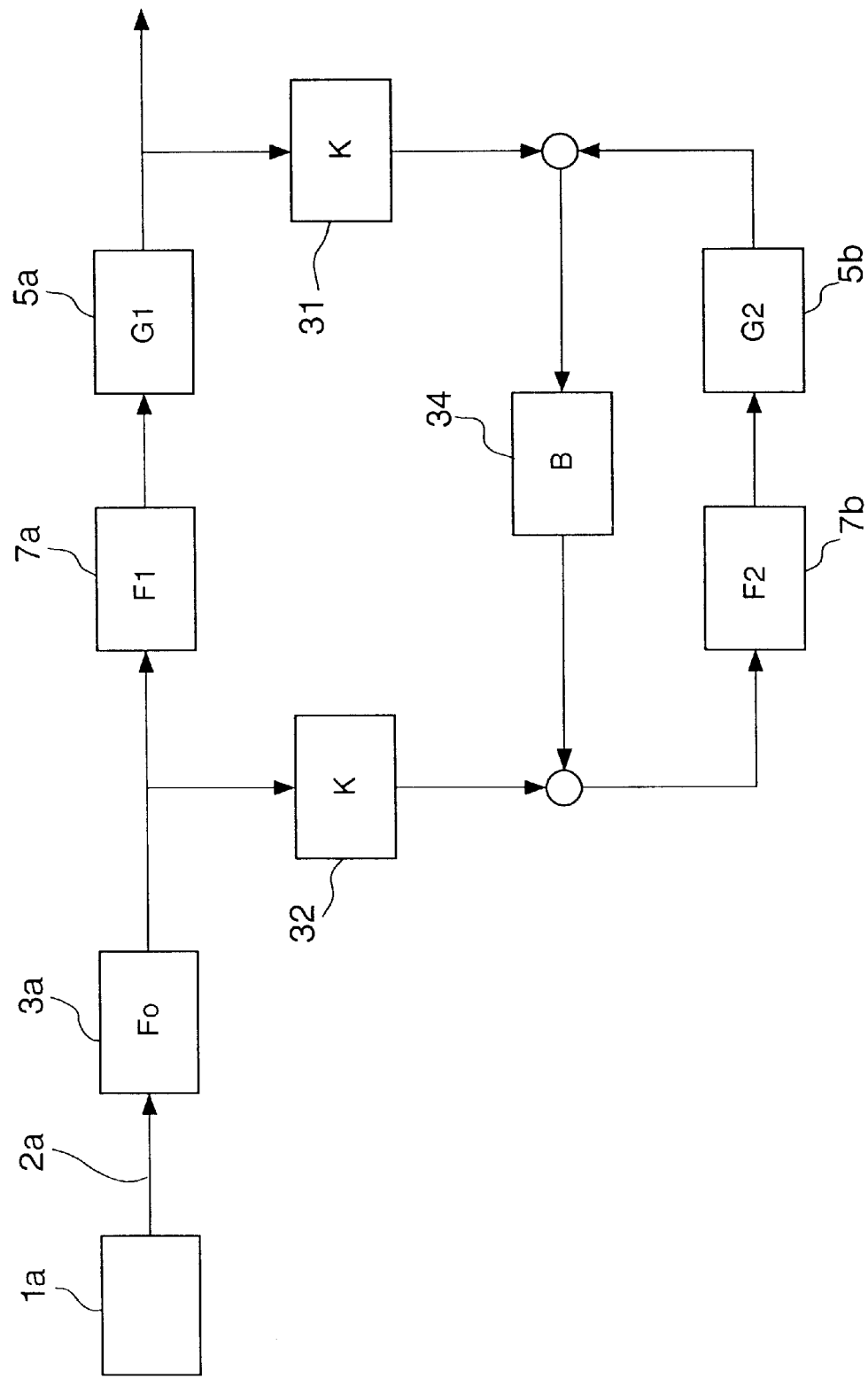
FIG. 6 is a block diagram showing a synchronous position control apparatus according to the sixth embodiment of the present invention.

FIG. 6 is a block diagram showing a synchronous position control apparatus according to the sixth embodiment; it shows a synchronous position control apparatus in which a synchronous compensation loop is added to the arrangement of the second embodiment shown in FIG. 2.

If a sufficient synchronous precision cannot be obtained by the methods of the fourth and fifth embodiments, the arrangement of the sixth embodiment in FIG. 6 can be adopted to further improve synchronous performance. In this arrangement as well as the fifth embodiment, a target command value for the second axis is calculated by multiplying a position command value for the first axis by a coefficient.

In the apparatus having a control system shown in FIG. 6, a prefilter 7a is inserted on the input stage of a position control means 5a in order to improve synchronous performance for target values along two axes, as described in the second embodiment.

The transfer functions of position control means for the first and second axes are set as G1 and G2. The transfer functions of the prefilters 7a and a prefilter 7b inserted on the input stages of the position control means 5a and a second position control means 5b are set as F1 and F2. F1 and F2 are set to satisfy F1×G1–F2×G2. At this time, the tracking characteristics of the position control means 5a and 5b for target position command values are almost the same, and no synchronous error occurs for the target positions. Since a synchronous error caused by disturbance cannot be compensated for by the prefilters 7a and 7b, the synchronous loop is effective for reducing the influence of disturbance.

Seventh Embodiment

Figure 7:
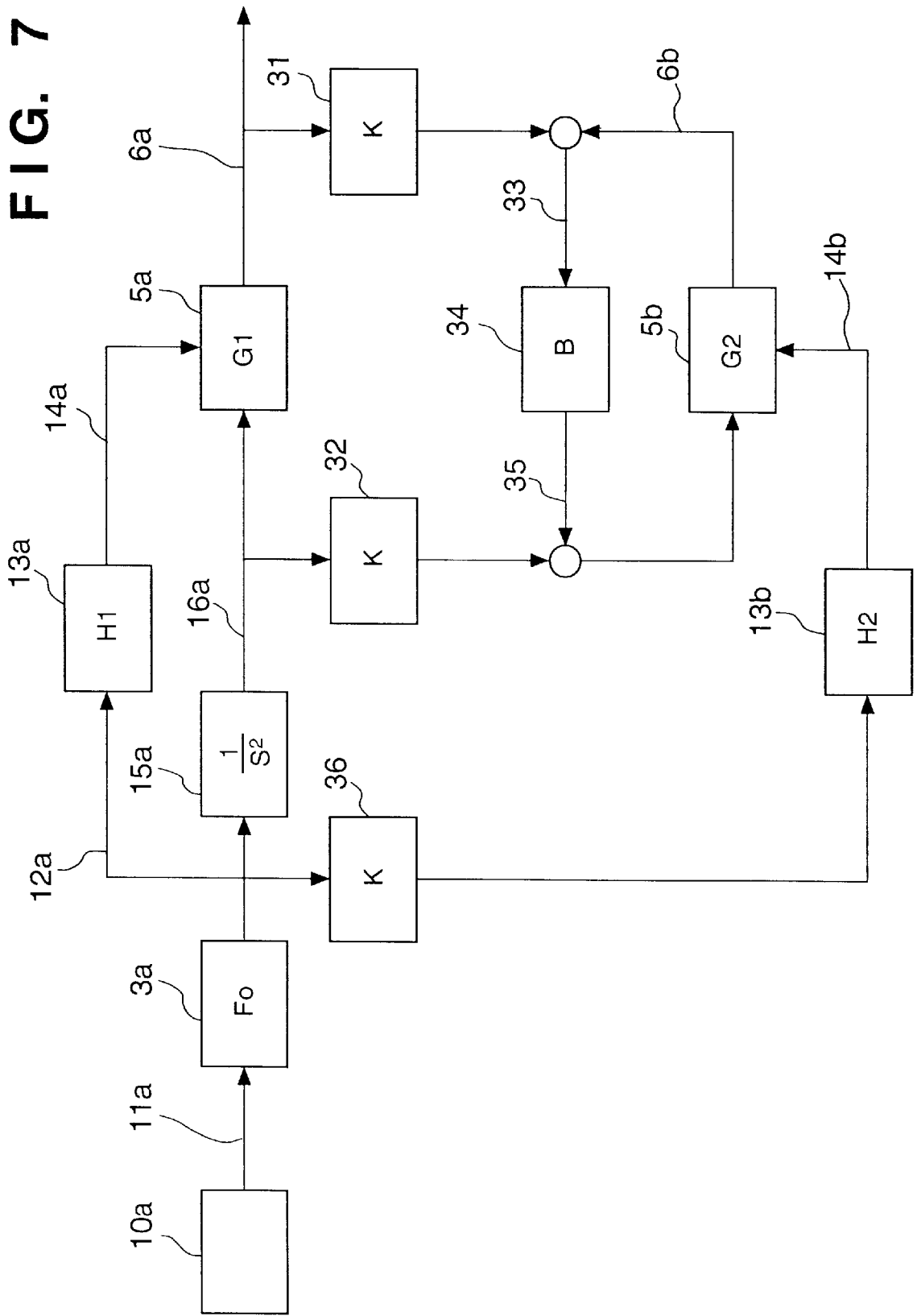
FIG. 7 is a block diagram showing a synchronous position control apparatus according to the seventh embodiment of the present invention.

FIG. 7 is a block diagram showing a synchronous position control apparatus according to the seventh embodiment of the present invention. As described in the third embodiment, the method using a prefilter in the sixth embodiment complicates the structure of the prefilter, and may be difficult to implement.

In the seventh embodiment, feedforward signals 14a and 14b are generated from a target acceleration signal 11a to drive position control means 5a and 5b. This can be easily implemented. The operation of the apparatus is almost the same as those described in the third and fourth embodiments.

Eighth Embodiment

Figure 11:
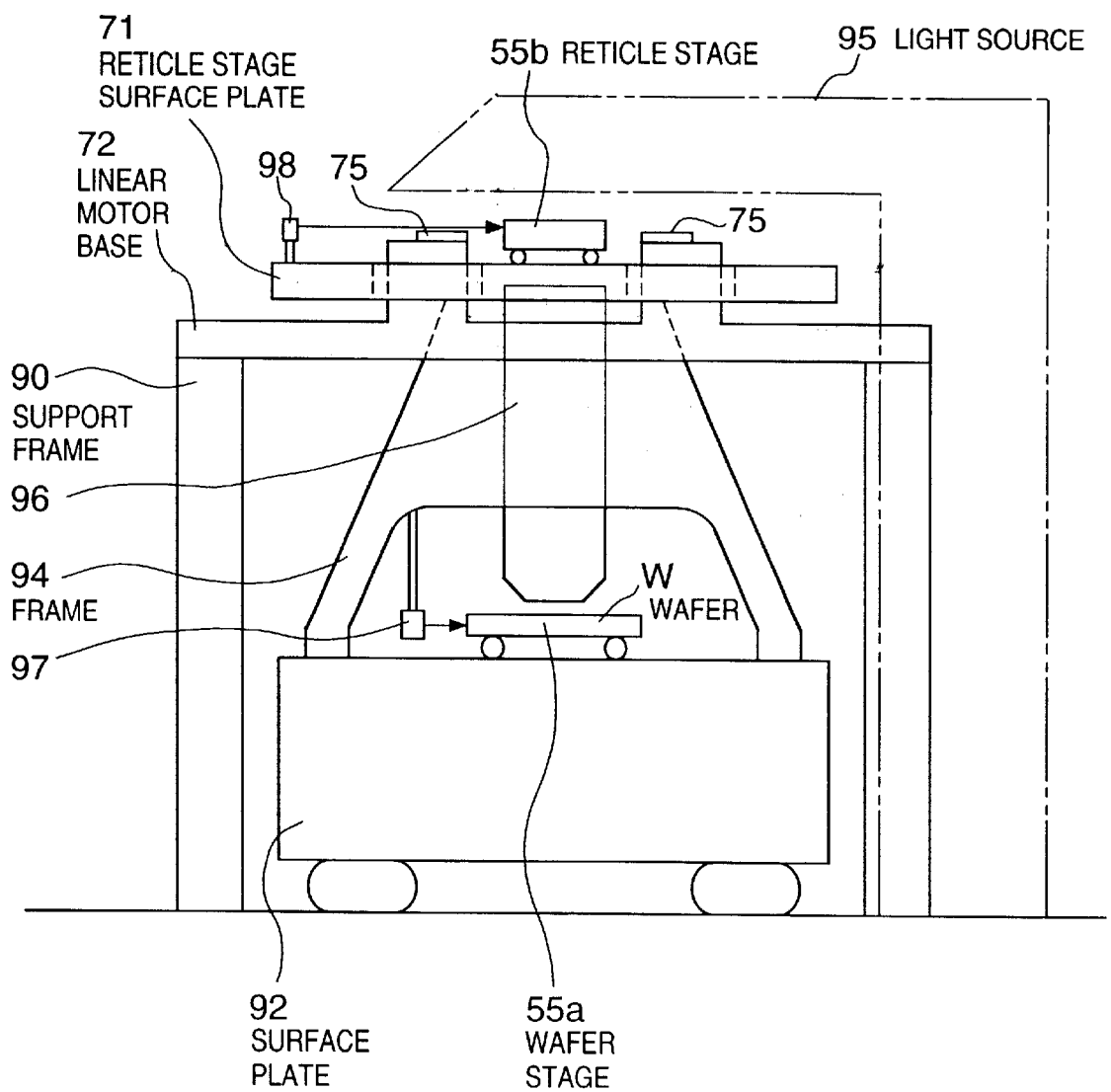
FIG. 11 is a side view showing a scanning exposure apparatus according to the eighth embodiment of the present invention.
Figure 12A:
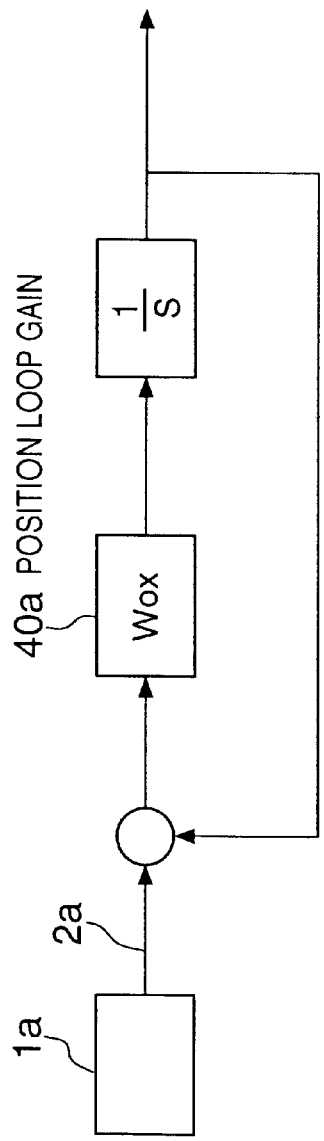
FIGS. 12A and 12B are block diagrams each showing the arrangement of a conventional synchronous position control system.
Figure 12B:
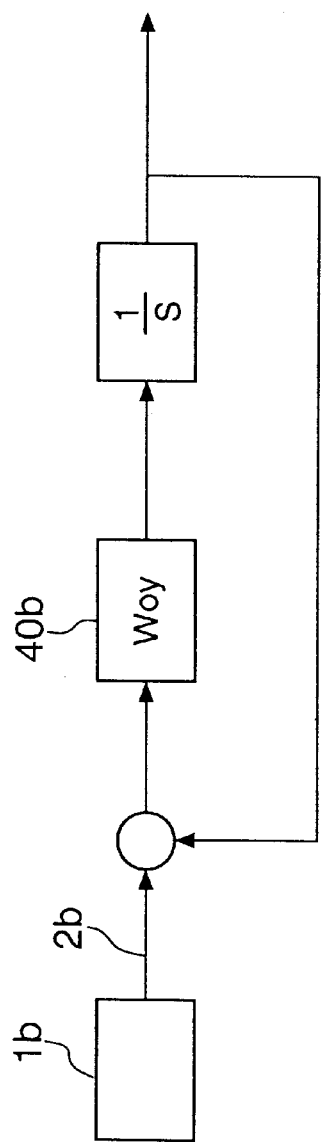
Figure 15:
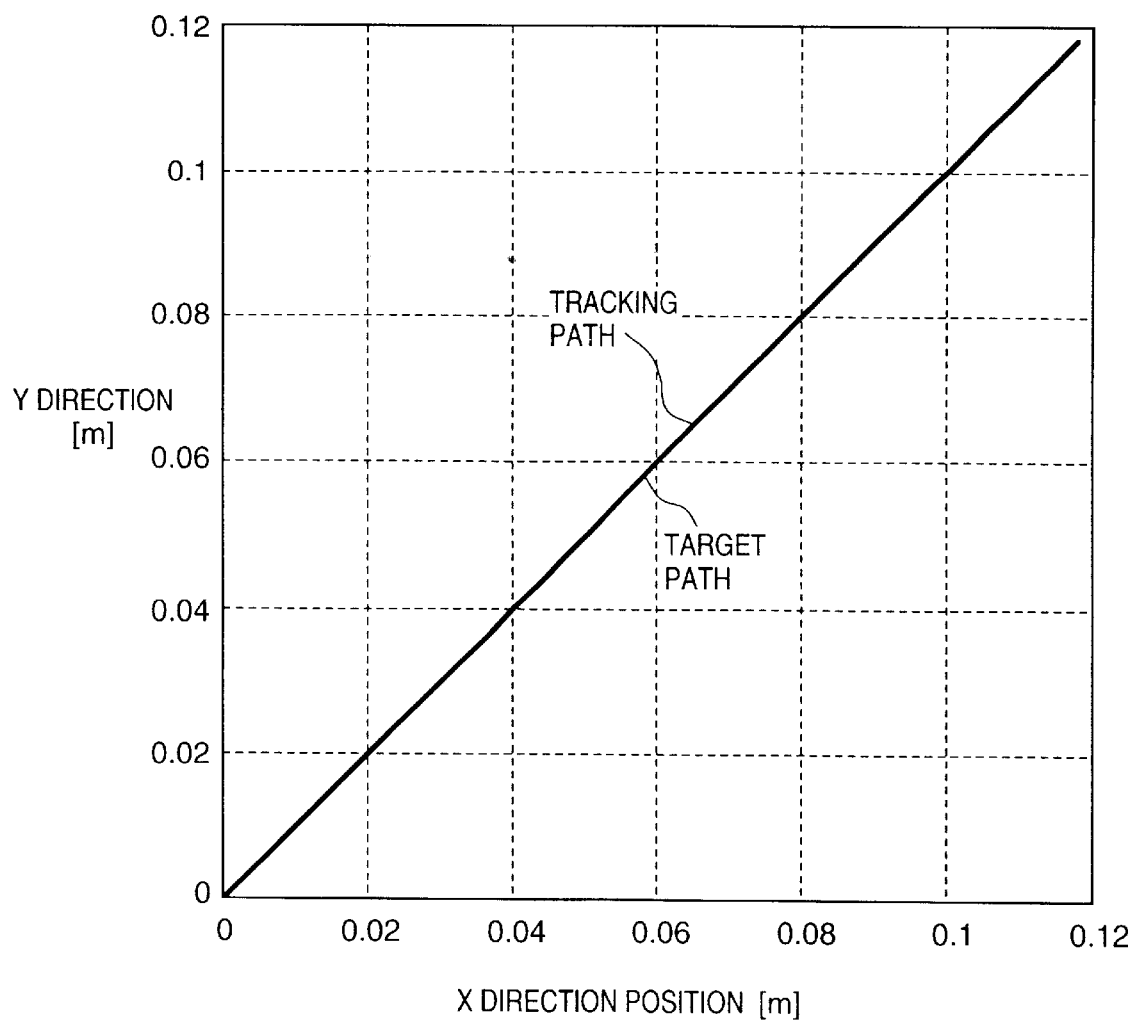
FIG. 15 is a graph of a tracking locus showing the contour control characteristic of the synchronous position control system shown in FIGS. 12A and 12B for a low gain.
Figure 17:
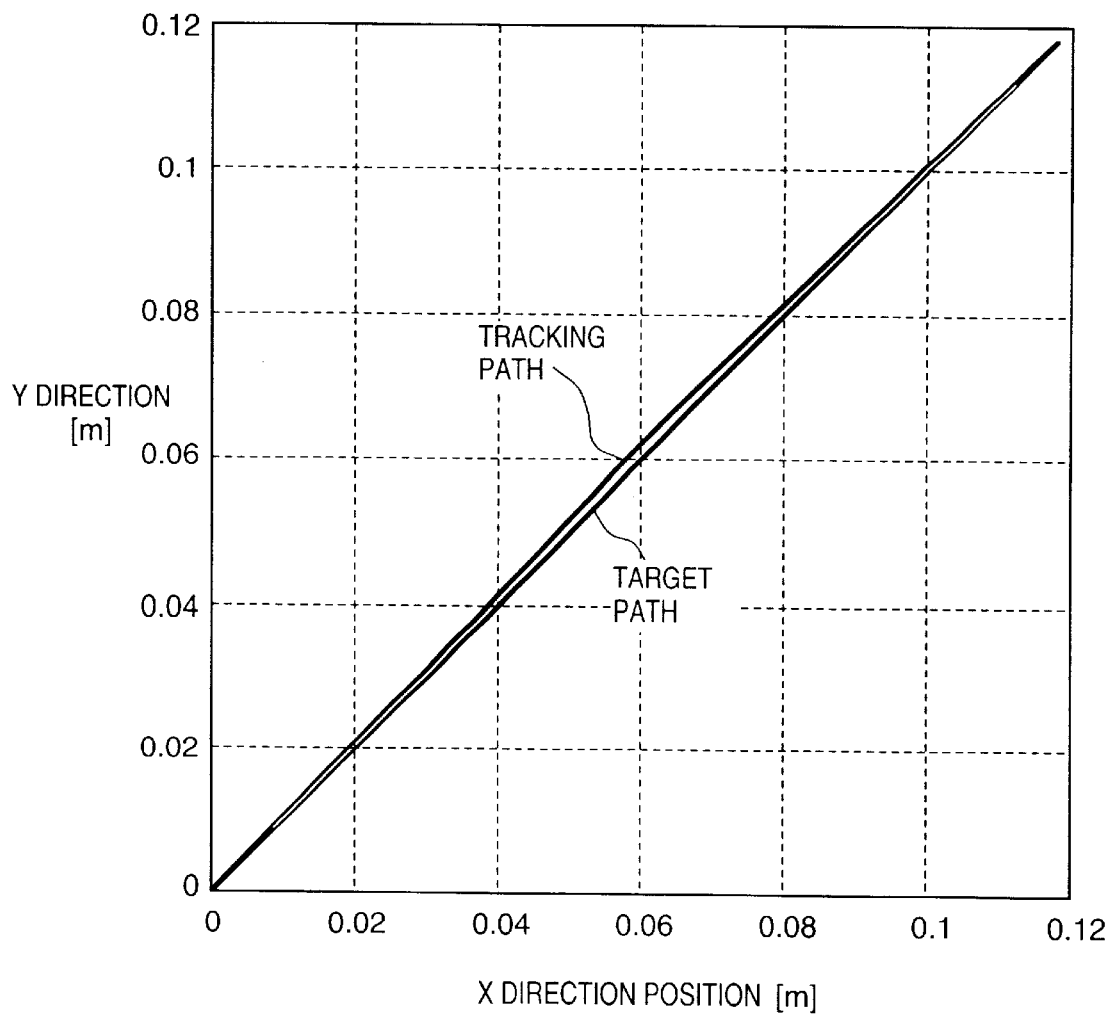
FIG. 17 is a graph of a tracking locus showing the contour control characteristic of the synchronous position control system shown in FIGS. 12A and 12B for a high gain.
Figure 18A:
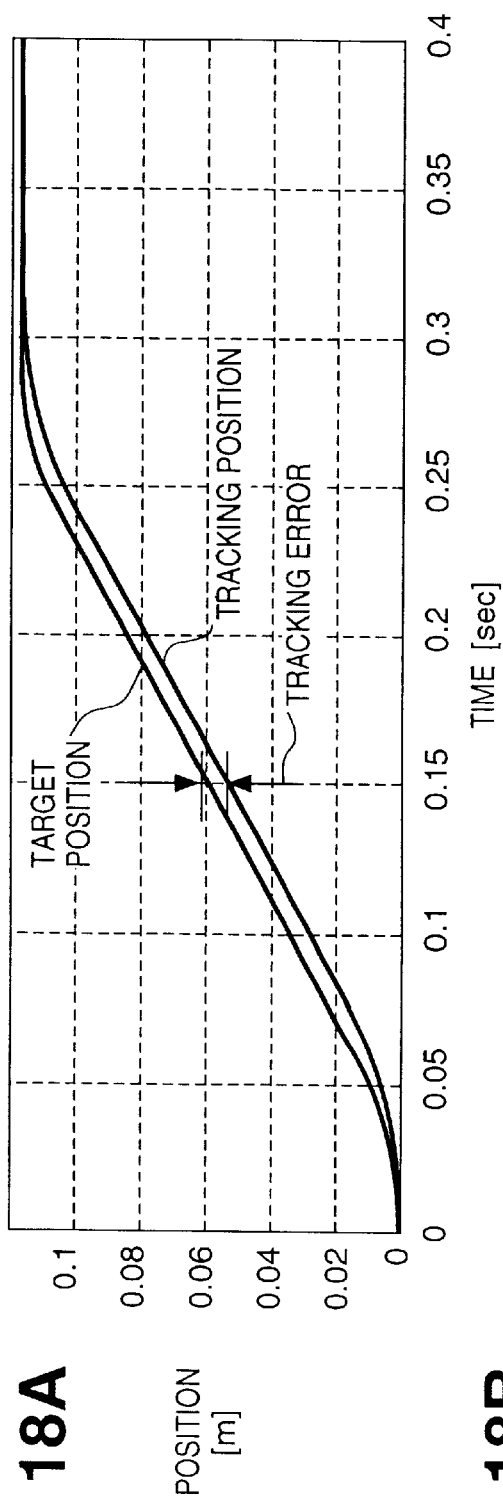
FIGS. 18A and 18B are graphs of a time response showing the contour control characteristic of the synchronous position control system shown in FIGS. 12A and 12B for a high gain.
Figure 18B:
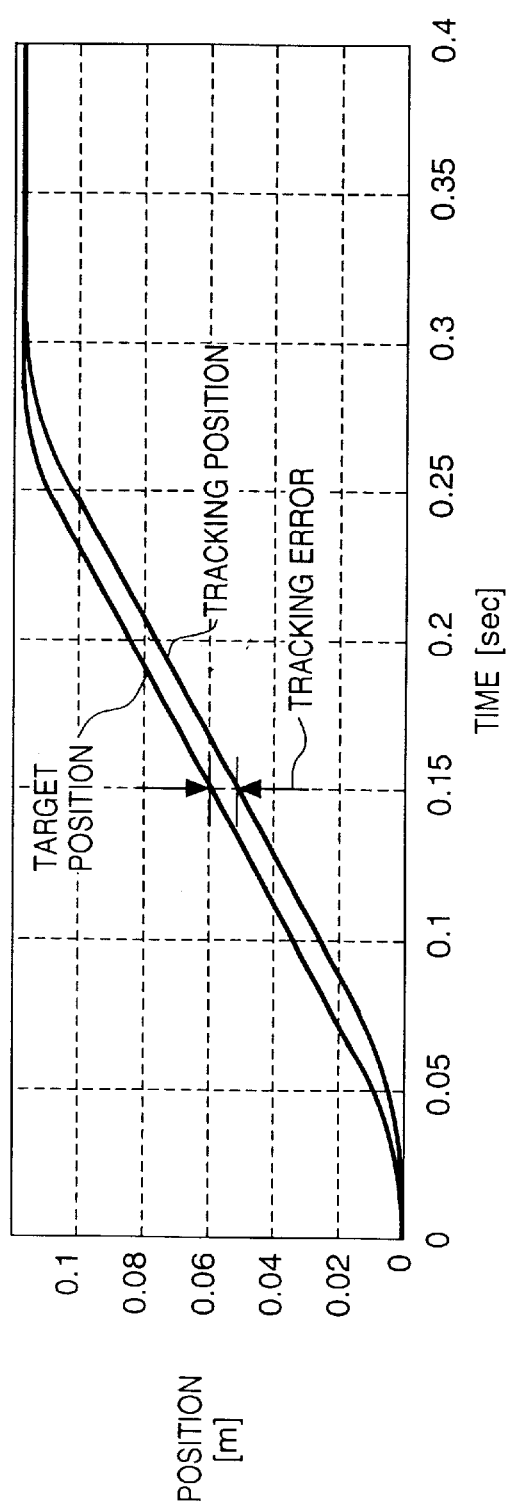

FIG. 11 is a side view showing a scanning exposure apparatus according to the eighth embodiment of the present invention. Although the first to seventh embodiments do not particularly limit the target, the eighth embodiment will exemplify a case in which the present invention is applied to a scanning exposure apparatus.

In the exposure apparatus, a reticle stage surface plate 71 for supporting a reticle stage 55b is integrated with a frame 94 which stands on a surface plate 92 for supporting a wafer stage 55a. Exposure light which exposes a wafer W on the wafer stage 55a through a reticle on the reticle stage 55b is emitted by a light source 95 represented by a broken line.

The frame 94 supports the reticle stage surface plate 71, and an optical projection system 96 between the reticle stage 55b and the wafer stage 55a. A stator 75 of a linear motor for accelerating/decelerating the reticle stage 55b is supported by a support frame 90 separate from the frame 94. The driving repulsion force of the motor of the reticle stage 55b may be transferred to the wafer stage 55a to act as disturbance to the driving unit or vibrate the optical projection system 96.

In the apparatus arrangement shown in FIG. 11, the wafer stage 55a is moved by the driving unit in synchronism with the reticle stage 55b. While the reticle stage 55b and wafer stage 55a move, their positions are continuously detected by laser interferometers 98 and 97, and fed back to the driving units of the reticle stage 55b and wafer stage 55a. This makes it possible to accurately synchronize the scan start positions of the reticle stage 55b and wafer stage 55a and control the scan speed in a constant-speed scan region with high precision.

Figure 8:
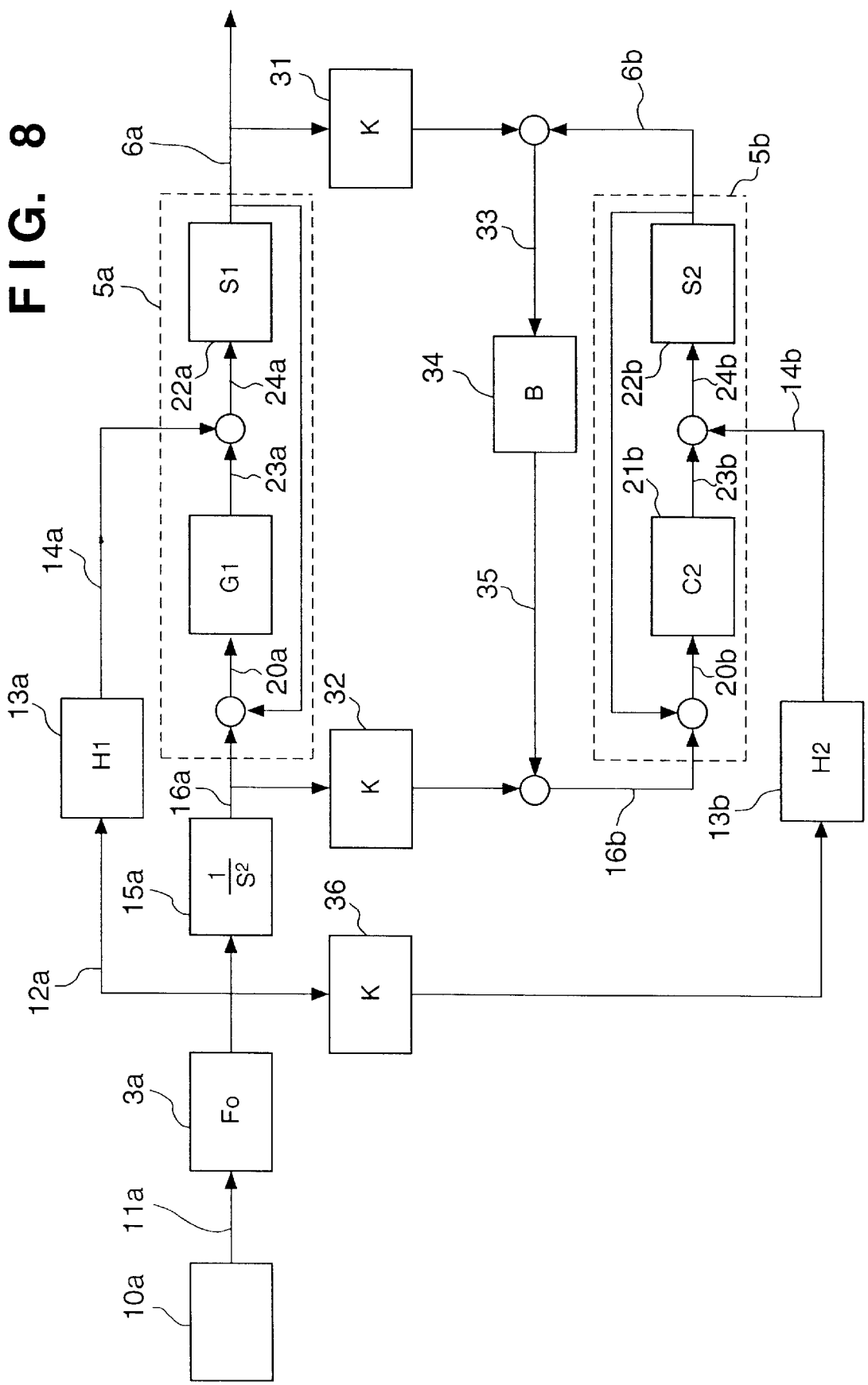
FIG. 8 is a block diagram showing a synchronous position control apparatus according to the eighth embodiment of the present invention.

The operation when the control system of FIG. 8, showing the seventh embodiment in more detail, is applied to this exposure apparatus will be explained. In this case, the wafer stage 55a and the reticle stage 55b undergo synchronous position control with a positional relationship corresponding to the projection magnification of the lens 96 using the optical center of the lens 96 as an origin.

Hence, a proportionality constant K in coefficient multiplying means 31 and 32 of FIG. 8 is the projection magnification of the lens, which is four in this embodiment. Both the wafer stage 55a and reticle stage 55b to be controlled have the arrangement shown in FIG. 10. Building components concerning the wafer stage 55a and reticle stage 55b are discriminated by reference symbols a and b.

As shown in FIG. 8, an acceleration command value 11a to the wafer stage 55a that is generated by a target acceleration command value generation means 10a is converted into a converted acceleration signal 12a whose high-frequency component is cut by a command value conversion means 3a. The converted acceleration command value 12a is integrated twice by the integral means 15a, and supplied as a position command value 16a to a wafer position control means 5a.

In the wafer position control means 5a, a positional error 20a as the difference between the position command value 16a and a wafer tracking position 6a measured by the laser interferometer 97 is input to a position compensator 21a.

The converted acceleration signal 12a is converted into a feedforward signal 14a by a compensation means 13a. A control input 24a as the sum of the feedforward signal 14a and an output signal 23a from the position compensator 21a is input to a control target 22a.

The control target 22a has the arrangement shown in FIG. 10. More specifically, the control input 24a is input as a current command value 50 to the control target 22a. The current command value 50 is amplified into a current 52 by a current amplifier 51, and the current 52 is supplied to a linear motor 53 serving as an actuator to generate a thrust 54. The thrust 54 drives the wafer stage 55a. The tracking position 6a at this time is measured by the laser interferometer 97.

The reticle stage 55b is driven similarly to the wafer stage 55a. That is, the position command value 16a to the wafer stage 55a is multiplied by a lens projection magnification of four by the coefficient multiplying means 32, and supplied as a target position command value 16 to the reticle stage 55b.

The measured wafer tracking position 6a is multiplied by a projection magnification of four by the coefficient multiplying means 31. The difference between the wafer tracking position 6a and the measured position 6b of the reticle stage 55b is calculated to obtain a synchronous error 33. The synchronous error 33 is converted into a correction value signal 35 by a correction means 34. The target position command value 16b to the reticle stage 55b is generated from the sum of the correction value signal 35 and a value prepared by multiplying the target wafer position value 16a by four.

In a reticle position control means 5b, a positional error 20b as the difference between the position command value 16b and the reticle tracking position 6b measured by the laser interferometer 98 is input to a position compensator 21b. The converted acceleration signal 12a is multiplied by 4 by a coefficient multiplying means 36, and converted into a feedforward signal 14b by a compensation means 13b.

A control input 24b to a control target 22b is generated from the sum of the feedforward signal 14b and a compensation control input 23b as an output from a position compensator 21b. The control target 22b has the arrangement shown in FIG. 10, similar to the wafer stage 55a.

The control input 24b is input as the current command value 50 to the control target 22b. The current command value 50 is amplified into a current 52 by the current amplifier 51, and the current 52 is supplied to the linear motor 53 serving as an actuator, thereby generating the thrust 54. The thrust 54 drives the reticle stage 55b. The reticle tracking position 6b at this time is measured by the laser interferometer 98.

The eighth embodiment has exemplified a system built using the wafer stage 55a as the first axis and the reticle stage 55b as the second axis. Even if the first and second axes are exchanged, the same system can be implemented.

As has been described above, according to the above-described embodiments, conversion means for target position command values are arranged, and their characteristics are set to almost the same high-frequency cutoff characteristics for respective axes. In addition, the cutoff frequency is set lower than the servo band in any position control means. As a result, response characteristics for target position command values substantially coincide with each other for all the axes. A synchronous position control apparatus having high synchronous performance can be easily designed and constituted.

The degree of freedom for adjusting the response characteristic for a target position command value can be increased. In simple positioning control which does not require any synchronous control, the target position command value is supplied without the mediacy of any conversion means. In this fashion, the apparatus can be easily used as a system having high positioning performance.

Prefilters are inserted on the input stages of position control means. The characteristics of the prefilters are set such that the transfer characteristics of combinations of the prefilters and the position control means for respective axes substantially coincide with each other for all the axes. The synchronous control characteristic can be further improved.

Position control performed on the basis of a feedforward signal based on a converted acceleration command value can improve tracking performance to a target value. The apparatus can be more easily constituted.

When the present invention is applied to synchronous position control for two axes, synchronous position control performance can be further improved using a synchronous loop.

As many apparently widely different embodiments of the present invention can be made without departing from the spirit and scope thereof, it is to be understood that the invention is not limited to the specific embodiments thereof except as defined in the appended claims.

What is claimed is:

1. A synchronous position control apparatus comprising:
   position controllers which perform control based on position feedback for a plurality of axes to be controlled;
   target position command value generators for respective axes which generate target position command values to be set in a respective position controller; and
   converters for respective axes which convert, on the basis of predetermined transfer functions, the target position command values for the respective axes that are output from the respective target position command value generators, and set the converted values in the respective position controllers,
   wherein characteristics of the transfer functions are set to substantially the same high-frequency cutoff characteristics for the respective axes, and the cutoff frequency of the transfer function is set to a smaller value than a servo band in any one position controller.

2. The apparatus according to claim 1, further comprising prefilters inserted on input stages of the respective position controllers for the respective axes,
wherein characteristics of said prefilters are set to make transfer characteristics of combinations of said prefilters and said position controllers substantially the same for all the plurality of axes.

3. The apparatus according to claim 1, wherein the plurality of axes are two axes, and
   the apparatus further comprises:
   a coefficient multiplier which multiplies a tracking position along one of the two axes by a predetermined coefficient;
   a corrector which obtains a correction value to be added to a position command value for one of the two axes on the basis of a synchronous error as a difference between the tracking position multiplied by the coefficient by said coefficient multiplier and a tracking position along another axis; and
   an adder which adds the correction value obtained by said corrector to the position command value for one of the two axes.

4. The apparatus according to claim 3, wherein one of the two axes is a wafer stage in a scanning semiconductor exposure apparatus, and the other axis is a reticle stage in the semiconductor exposure apparatus.

5. A synchronous position control apparatus comprising:
   an acceleration command value generator which generates target acceleration command values for a plurality of axes to be controlled;
   compensators for the respective axes which convert the respective target acceleration command values in accordance with predetermined transfer functions, and output the converted values as converted acceleration command values;
   integrators for the respective axes which integrate the respective converted acceleration command values twice, and output the integrated values as position command values;
   correctors for the respective axes which perform predetermined compensation for the respective converted acceleration command values, and output the compensated values as feedforward signals; and
   position controllers for performing control based on position feedback control for the respective axes on the basis of the respective position command values and the feedforward signals,
   wherein characteristics of the transfer functions are set to be substantially the same high-frequency cutoff characteristics for the respective axes, and the cutoff frequency of the transfer function is set to a smaller value than a servo band in any one position controller.

6. The apparatus according to claim 5, wherein the plurality of axes are two axes, and
   the apparatus further comprises:
   a coefficient multiplier which multiplies a tracking position along one of the two axes by a predetermined coefficient;
   a corrector which obtains a correction value to be added to the position command value for one of the two axes on the basis of a synchronous error as a difference between the tracking position multiplied by the coefficient by said coefficient multiplier and a tracking position along another axis; and
   an adder which adds the correction value obtained by said corrector to the position command value for one of the two axes.

7. The apparatus according to claim 6, wherein one of the two axes is a wafer stage in a scanning semiconductor exposure apparatus, and the other axis is a reticle stage in the semiconductor exposure apparatus.

8. A synchronous position control method of performing synchronous position control by setting target position command values for position control mechanisms for performing control based on position feedback control for a plurality of axes to be controlled, said method comprising steps of:

converting the respective target position command values for the respective axes on the basis of predetermined transfer functions, and setting the converted values in the respective position control mechanisms; and setting characteristics of the transfer functions to substantially the same high-frequency cutoff characteristics for the respective axes, and setting the cutoff frequency of the transfer function to a smaller value than a servo band in said any position control mechanism.

9. The method according to claim 8, wherein prefilters are inserted on input stages of the respective position control mechanisms for the respective axes, and characteristics of the respective prefilters are set to make transfer characteristics of combinations of the prefilters and the position control mechanisms substantially the same for all the plurality of axes.

10. The method according to claim 8, wherein the plurality of axes are two axes, and the method further comprises:

a coefficient multiplying step of multiplying a tracking position along one of the two axes by a predetermined coefficient;

a correction step of obtaining a correction value to be added to a position command value for one of the two axes on the basis of a synchronous error as a difference between the tracking position multiplied by the coefficient in said coefficient multiplying step and a tracking position along another axis; and an addition step of adding the correction value obtained in said correction step to the position command value for one of the two axes.

11. The method according to claim 10, wherein one of the two axes is a wafer stage in a scanning semiconductor exposure apparatus, and the other axis is a reticle stage in the semiconductor exposure apparatus.

12. A synchronous position control method comprising:

an acceleration command value generation step of generating target acceleration command values for a plurality of axes to be controlled;

a conversion step of converting the respective target acceleration command values in accordance with predetermined transfer functions for the respective axes, and outputting the converted values as converted acceleration command values;

an integral step of integrating the respective converted acceleration command values twice, and outputting the integrated values as position command values for the respective axes;

a compensation step of performing predetermined compensation for the respective converted acceleration command values, and outputting the compensated values as feedforward signals for the respective axes; and a position control step of performing control based on position feedback control for the respective axes on the basis of the position command values and the feedforward signals, wherein characteristics of the transfer functions are set to substantially the same high-frequency cutoff characteristics for the respective axes, and the cutoff frequency of the transfer function is set to a smaller value than a servo band in said any position feedback control.

13. The method according to claim 12, wherein the plurality of axes are two axes, and the method further comprises:

a coefficient multiplying step of multiplying a tracking position along one of the two axes by a predetermined coefficient;

a correction step of obtaining a correction value to be added to the position command value for one of the two axes on the basis of a synchronous error as a difference between the tracking position multiplied by the coefficient in said coefficient multiplying step and a tracking position along another axis; and an addition step of adding the correction value obtained in said correction step to the position command value for one of the two axes.

14. The method according to claim 13, wherein one of the two axes is a wafer stage in a scanning semiconductor exposure apparatus, and the other axis is a reticle stage in the semiconductor exposure apparatus.

15. A position control apparatus comprising:

a first control loop for performing a first position feedback control for a first control axis;

a second control loop for performing a second position feedback control for a second control axis; and plural prefilters set outside the first and second control loops so that transfer characteristics of the first and second control axes are substantially the same.

16. The position control apparatus according to claim 15, wherein the plural prefilters include a first prefilter set for the first control axis and a second prefilter set for the second control axis.

17. The position control apparatus according to claim 16, wherein characteristics of the first and second prefilters are set so that a transfer characteristic of a combination of the first control loop and the first prefilter is substantially the same as a transfer characteristic of a combination of the second control loop and the second prefilter.

18. The position control apparatus according to claim 16, wherein the first and second prefilters are set to substantially the same high-frequency cutoff characteristics.

19. The position control apparatus according to claim 15, wherein cutoff frequencies of the plural prefilters are smaller than servo bands of the first and second control loops.

20. The position control apparatus according to claim 19, wherein the plural prefilters include a first prefilter for the first control axis and a second prefilter for the second control axis.

21. The position control apparatus according to claim 20, wherein the first and second prefilters are set to substantially the same high-frequency cutoff characteristics.

22. The position control apparatus according to claim 15, wherein the first control axis is a wafer stage in a semiconductor exposure apparatus and wherein the second control axis is a reticle stage in the semiconductor exposure apparatus.

23. A position control method comprising the steps of:

performing a first position feedback control for a first control axis by a first control loop;

performing a second position feedback control for a second control axis by a second control loop; and controlling transfer characteristics of the first and second control axes to be substantially the same by plural prefilters set outside the first and second control loops.

24. The position control method according to claim 23, wherein the plural prefilters include a first prefilter set for the first control axis and a second prefilter set for the second control axis.

25. The position control method according to claim 24, wherein characteristics of the first and second prefilters are set so that a transfer characteristic of a combination of the first control loop and the first prefilter is substantially the same as a transfer characteristic of a combination of the second control loop and the second prefilter.

26. The position control method according to claim 24, wherein the first and second prefilters are set to substantially the same high-frequency cutoff characteristics.

27. The position control method according to claim 23, wherein cutoff frequencies of the plural prefilters are smaller than servo bands of the first and second control loops.

28. The position control method according to claim 27, wherein the plural prefilters include a first prefilter for the first control axis and a second prefilter for the second control axis.

29. The position control method according to claim 28, wherein the first and second prefilters are set to substantially the same high-frequency cutoff characteristics.

30. The position control method according to claim 23, wherein the first control axis is a wafer stage in a semiconductor exposure apparatus and wherein the second control axis is a reticle stage in the semiconductor exposure apparatus.

* * * * *

UNITED STATES PATENT AND TRADEMARK OFFICE
CERTIFICATE OF CORRECTION

PATENT NO.     : 6,714,842 B1
DATED          : March 30, 2004
INVENTOR(S)    : Hiroshi Ito It is certified that error appears in the above-identified patent and that said Letters Patent is hereby corrected as shown below:

<u>Column 9,</u>
Line 13, "Hi" should read -- H1 --.

<u>Column 12,</u>
Line 25, "24*a*is" should read -- 24*a* is --.

Signed and Sealed this

Tenth Day of August, 2004

JON W. DUDAS
*Acting Director of the United States Patent and Trademark Office*